US008349631B2

(12) United States Patent
Tseng et al.

(10) Patent No.: US 8,349,631 B2
(45) Date of Patent: Jan. 8, 2013

(54) METHOD FOR FABRICATING THIN FILM TRANSISTOR ARRAY SUBSTRATE

(75) Inventors: Shine-Kai Tseng, Taoyuan County (TW); Han-Tu Lin, Taichung County (TW); Shiun-Chang Jan, Taipei (TW); Kuo-Lung Fang, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/225,568

(22) Filed: Sep. 6, 2011

(65) Prior Publication Data

US 2011/0318856 A1    Dec. 29, 2011

Related U.S. Application Data

(62) Division of application No. 12/356,090, filed on Jan. 20, 2009, now Pat. No. 8,058,087.

(30) Foreign Application Priority Data

Jul. 9, 2008  (TW) .............................. 97125980 A

(51) Int. Cl.
H01L 21/338  (2006.01)
H01L 31/112  (2006.01)
(52) U.S. Cl. .......... 438/34; 438/149; 257/223; 257/291; 257/292

(58) Field of Classification Search .................. 438/149, 438/411
See application file for complete search history.

(56) References Cited

U.S. PATENT DOCUMENTS

| 6,060,714 | A  | * | 5/2000 | Zhong et al. ............. 250/370.09 |
| 6,911,669 | B2 | * | 6/2005 | Lai ................................. 257/59 |
| 2007/0008442 | A1 | * | 1/2007 | Ishigaki et al. ................. 349/42 |
| 2007/0105287 | A1 | * | 5/2007 | Peng ............................. 438/166 |
| 2007/0249111 | A1 | * | 10/2007 | Lin ............................... 438/182 |

* cited by examiner

*Primary Examiner* — Julio J Maldonado
*Assistant Examiner* — Mohammad Choudhry
(74) *Attorney, Agent, or Firm* — Jianq Chyun IP Office

(57) ABSTRACT

A method for fabricating a TFT array substrate includes following steps. A gate pattern and a first pad pattern are formed on a substrate. A gate insulation layer and a semiconductor layer covering the two patterns are sequentially formed. A patterned photoresist layer having different resist blocks is formed, and patterns and thicknesses of the resist blocks in different regions are adjusted. The semiconductor layer and the gate insulation layer above the first pad pattern are removed through performing an etching process and reducing a thickness of the patterned photoresist layer. After removing the patterned photoresist layer, a source pattern, a drain pattern, and a second pad pattern electrically connected to the first pad pattern are formed. A patterned passivation layer is formed on the gate insulation layer and has a second opening exposing the source pattern or the drain pattern and a third opening exposing the second pad pattern.

12 Claims, 21 Drawing Sheets

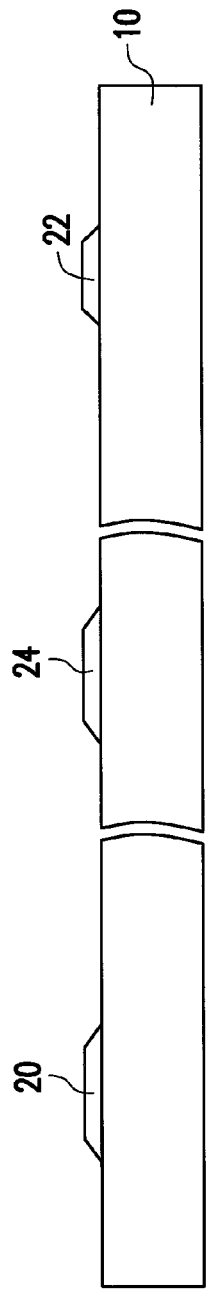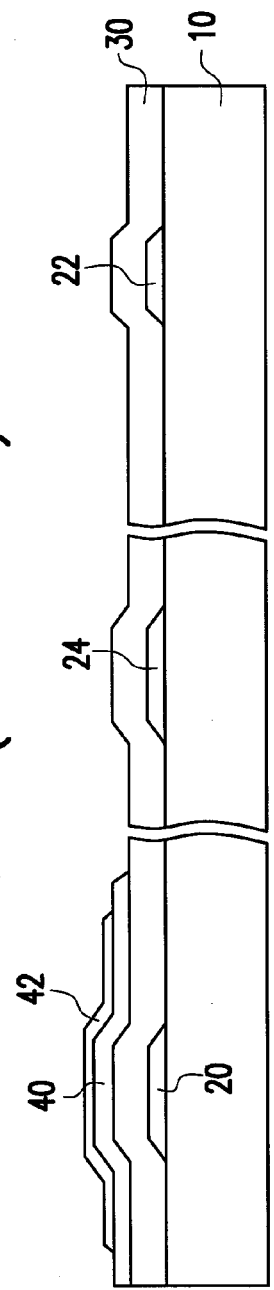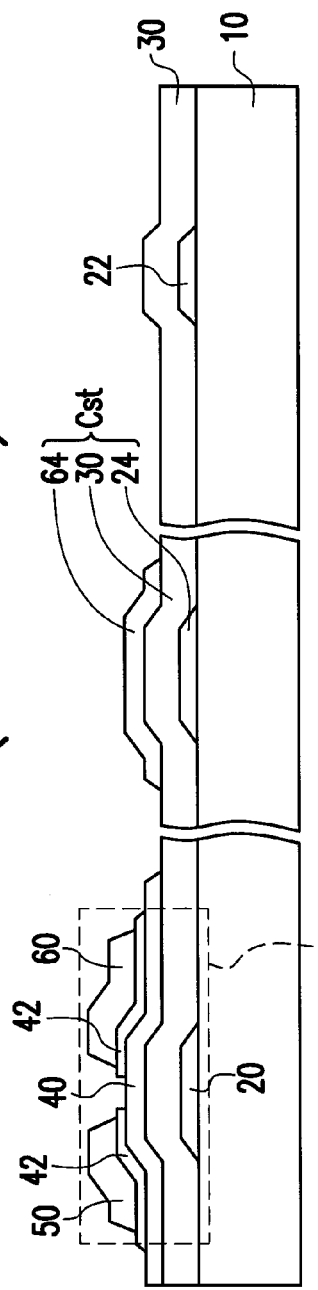

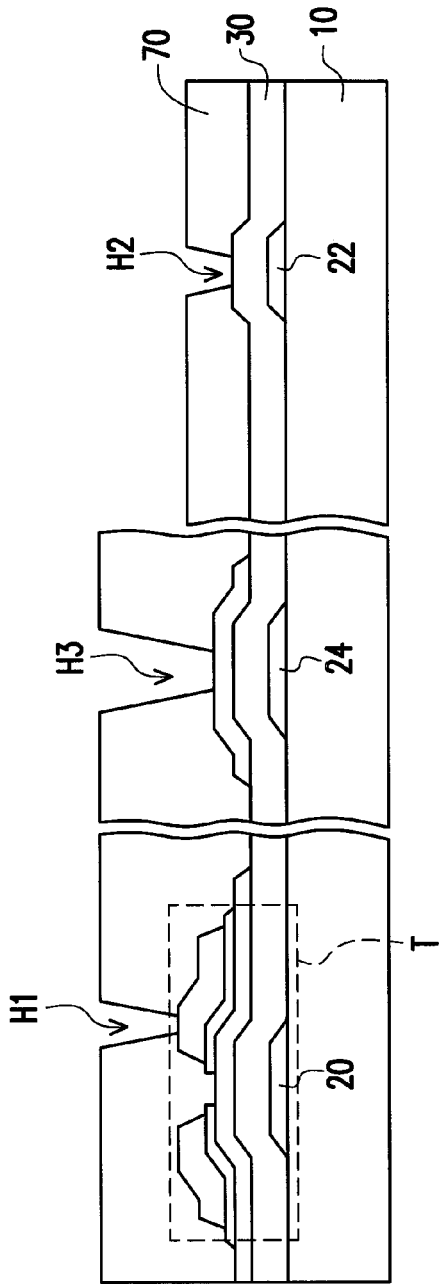
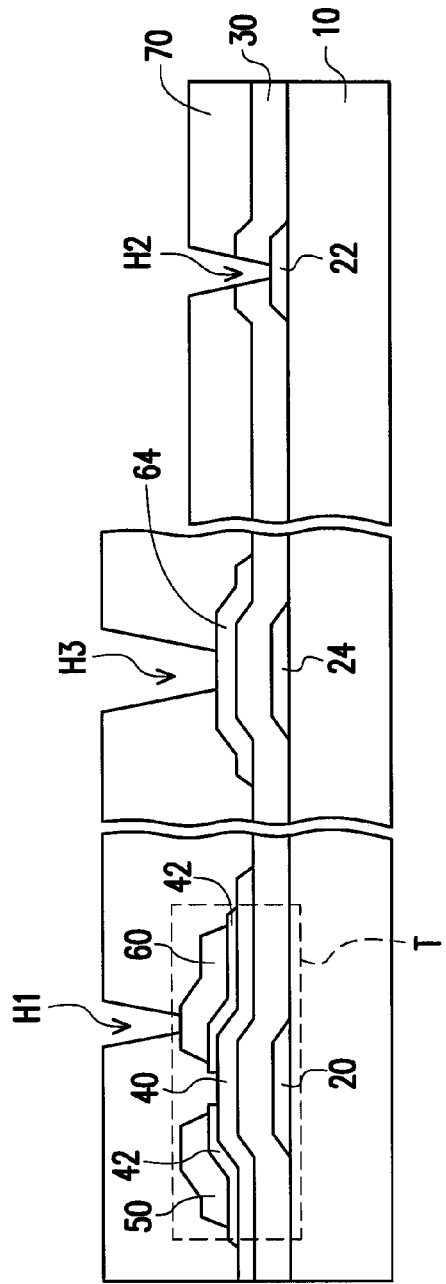
FIG. 1D (PRIOR ART)
FIG. 1E (PRIOR ART)

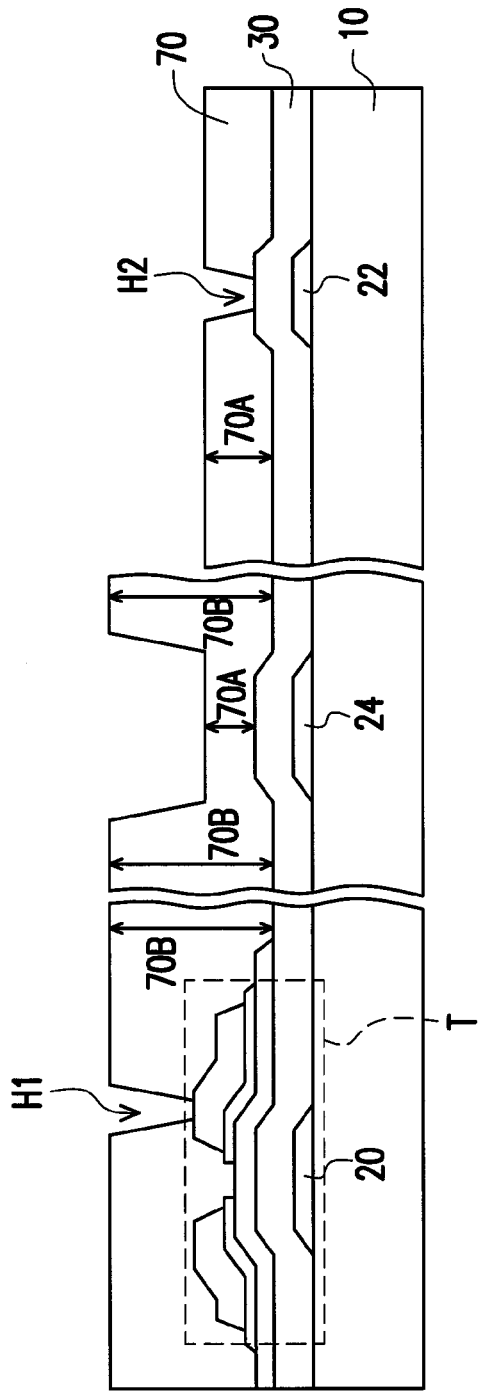
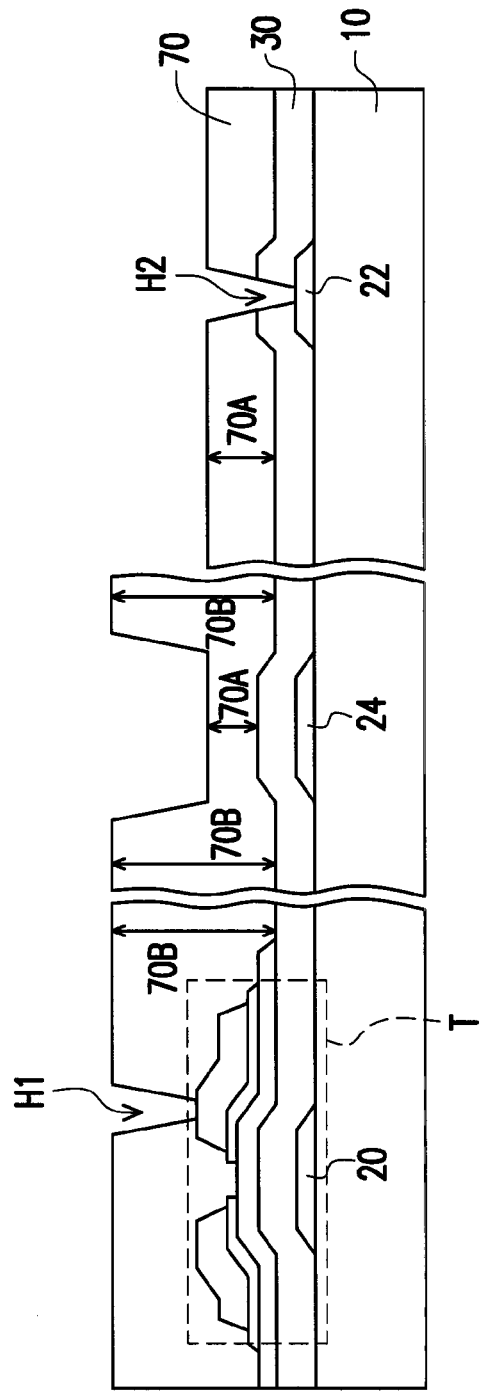
FIG. 2D
FIG. 2E

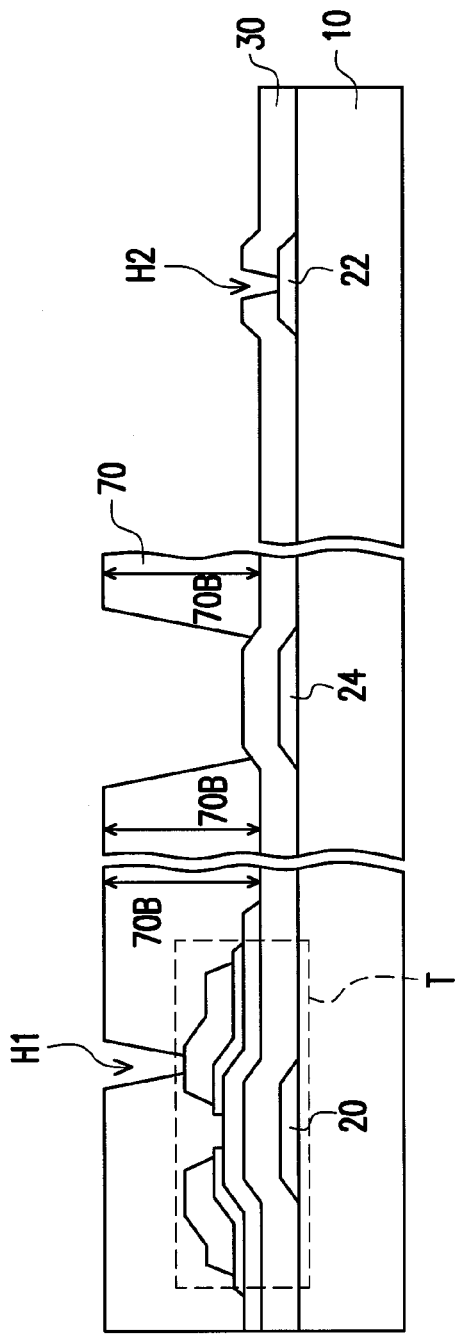
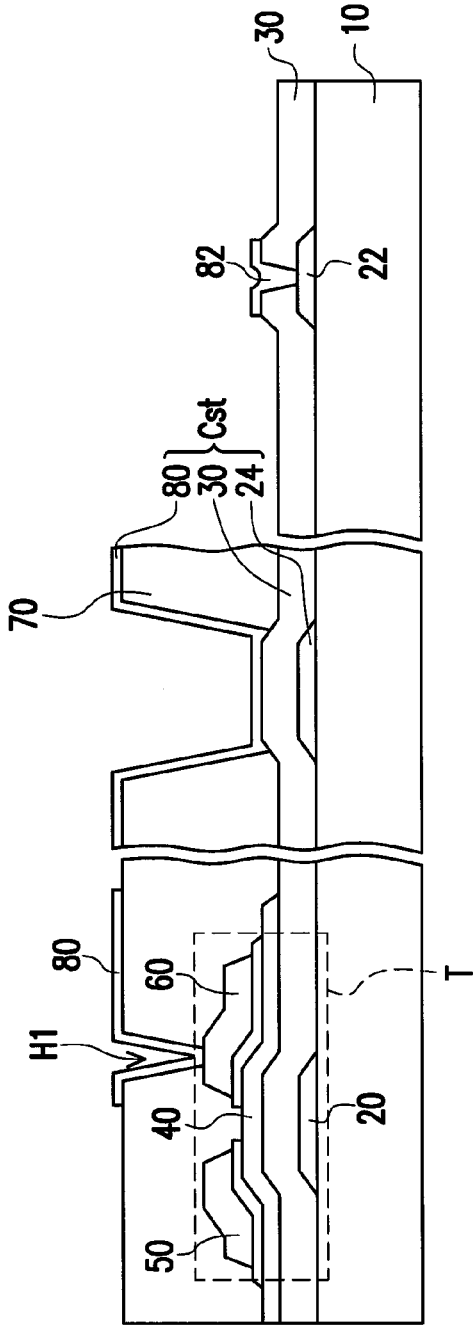
FIG. 2F
FIG. 2G

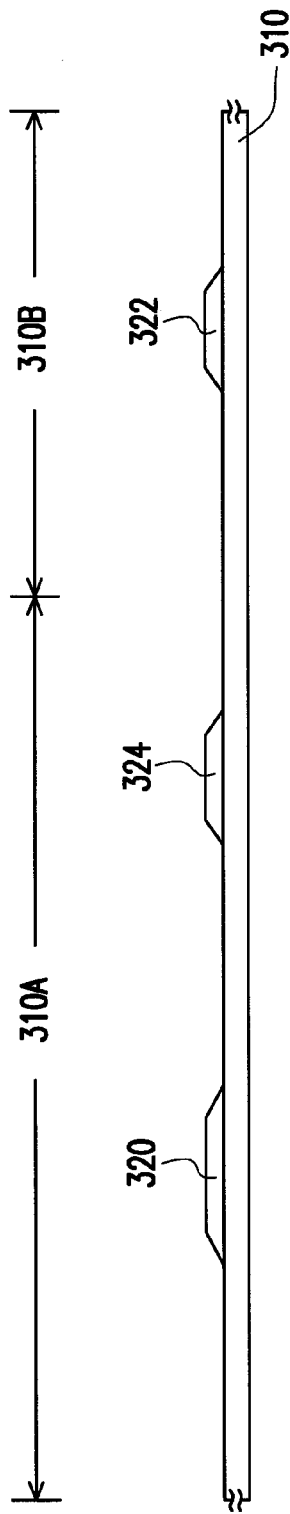
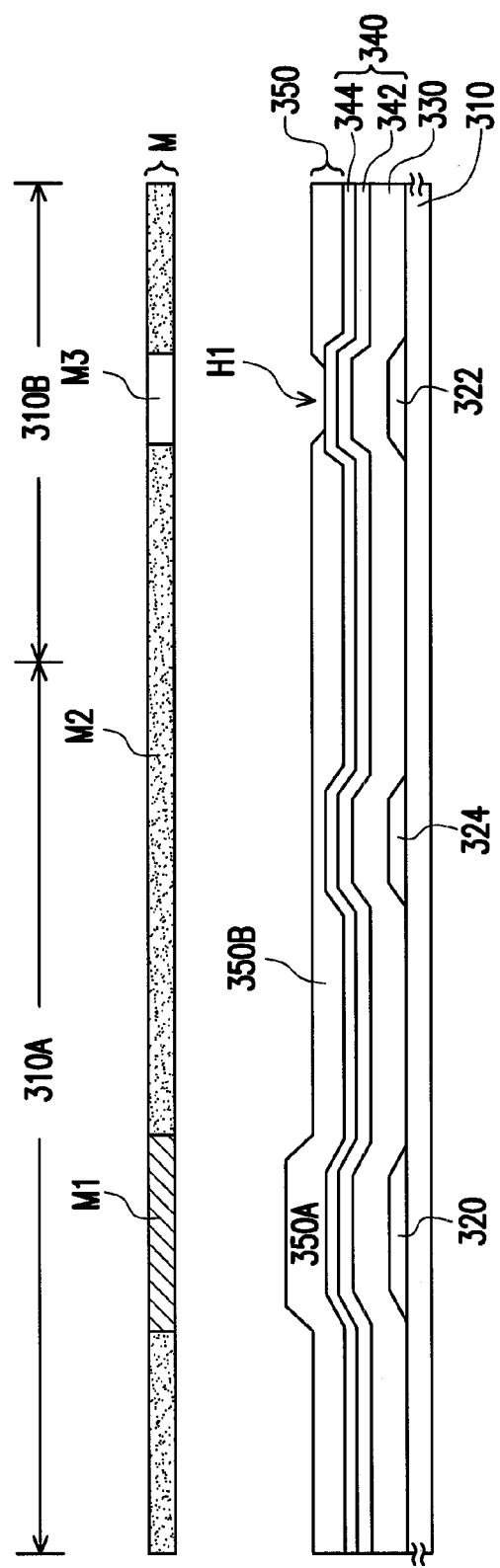

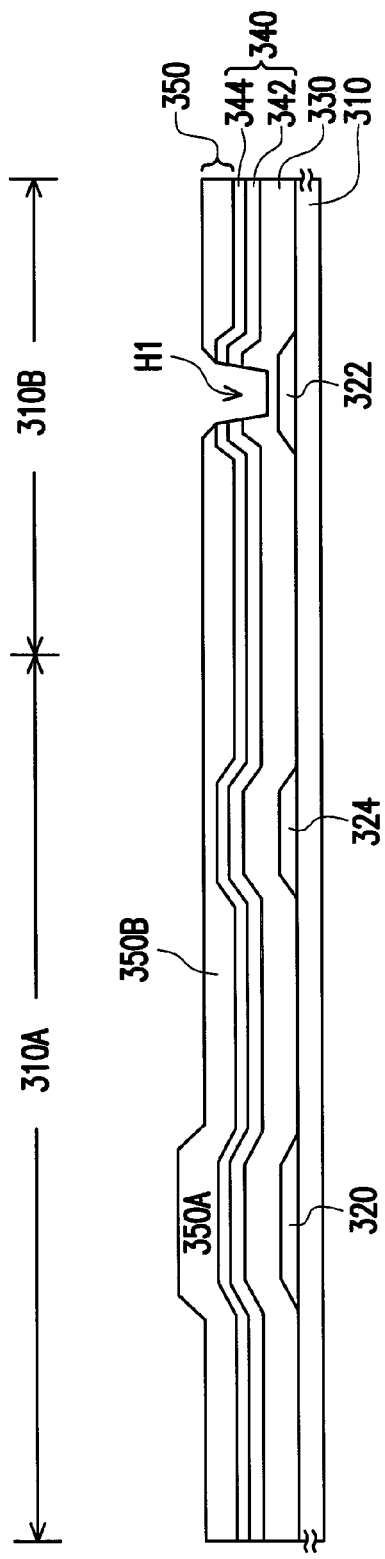
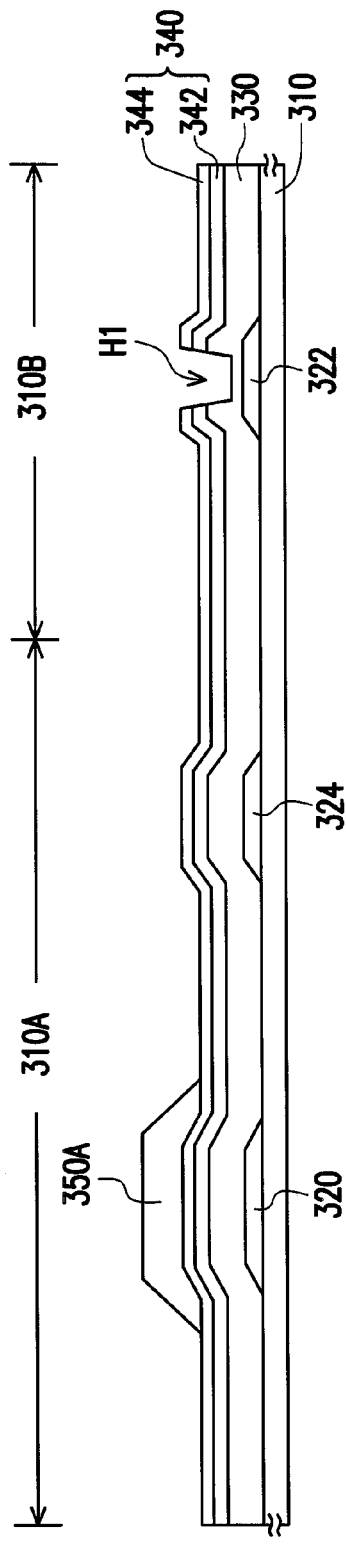
FIG. 3C
FIG. 3D

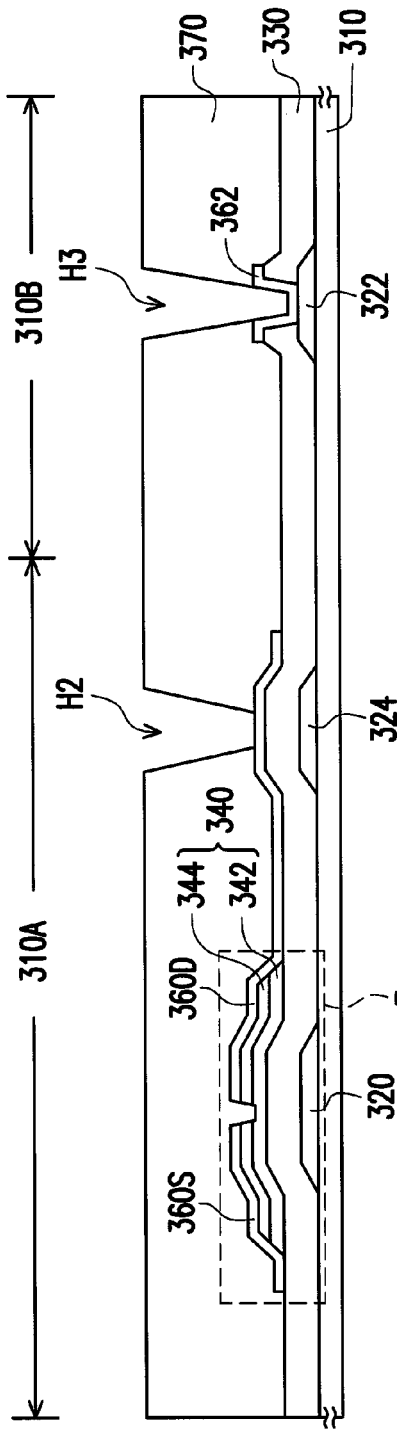
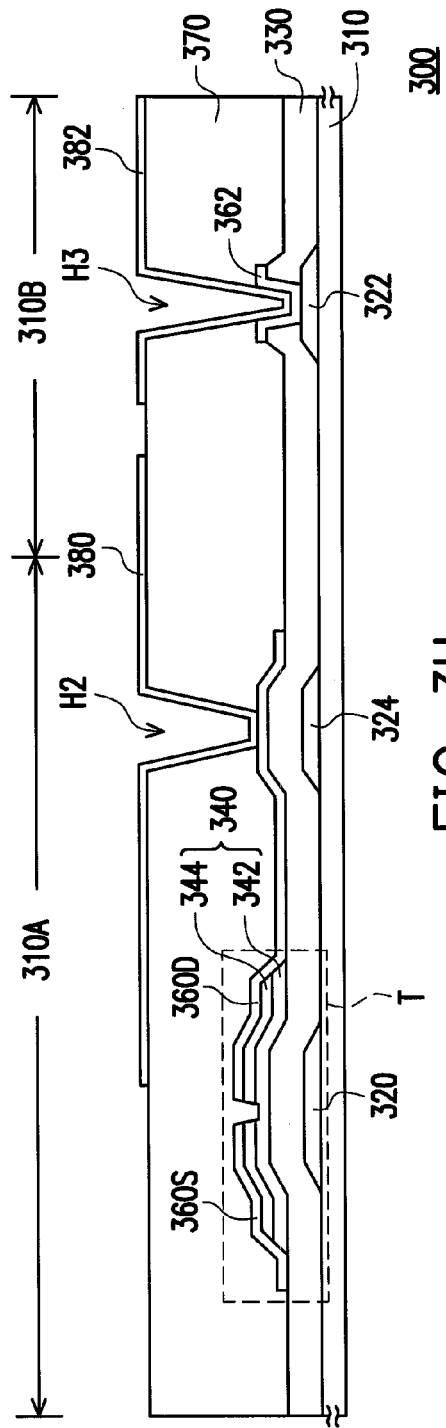

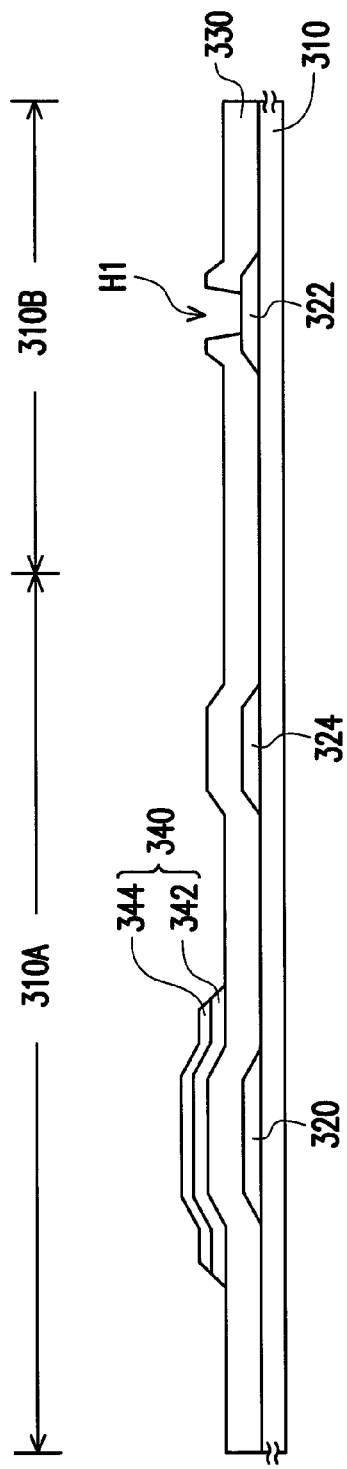
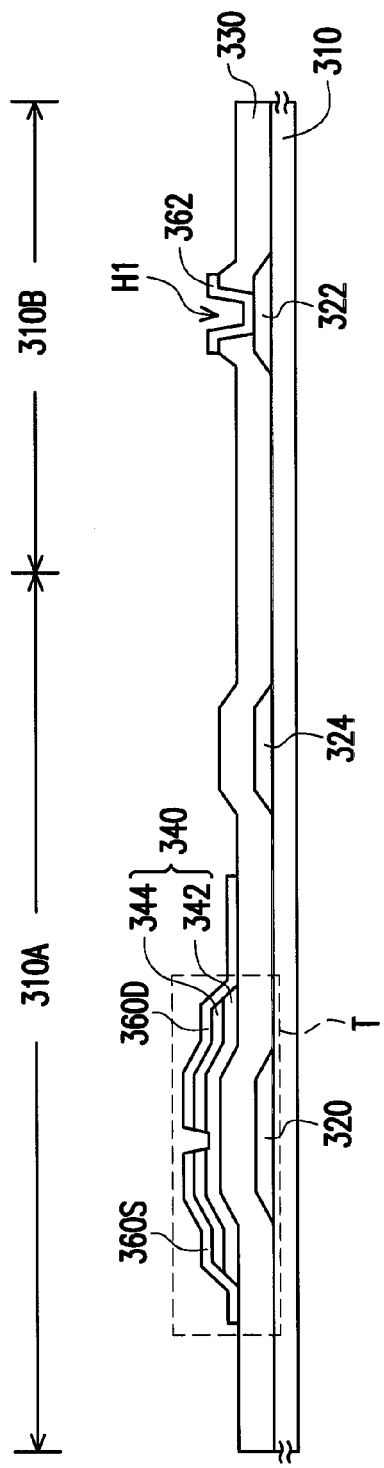
FIG. 4E
FIG. 4F

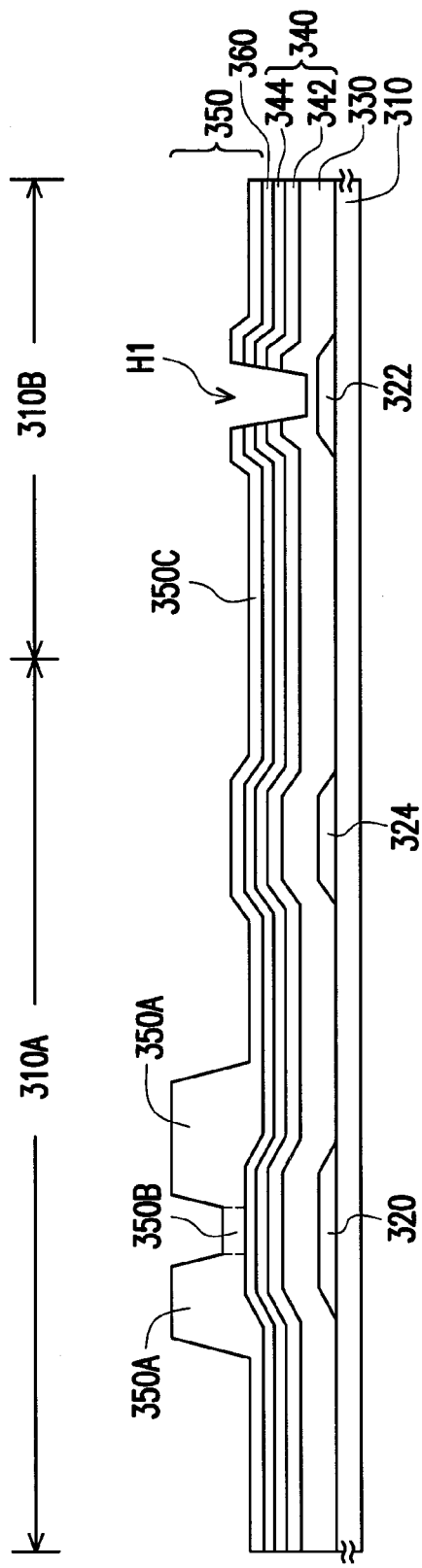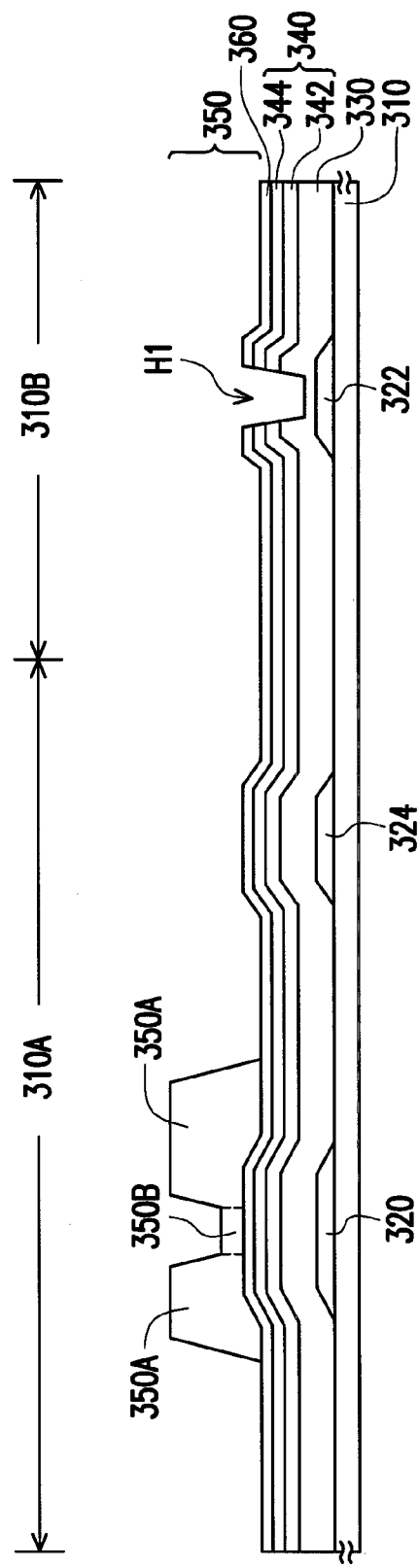

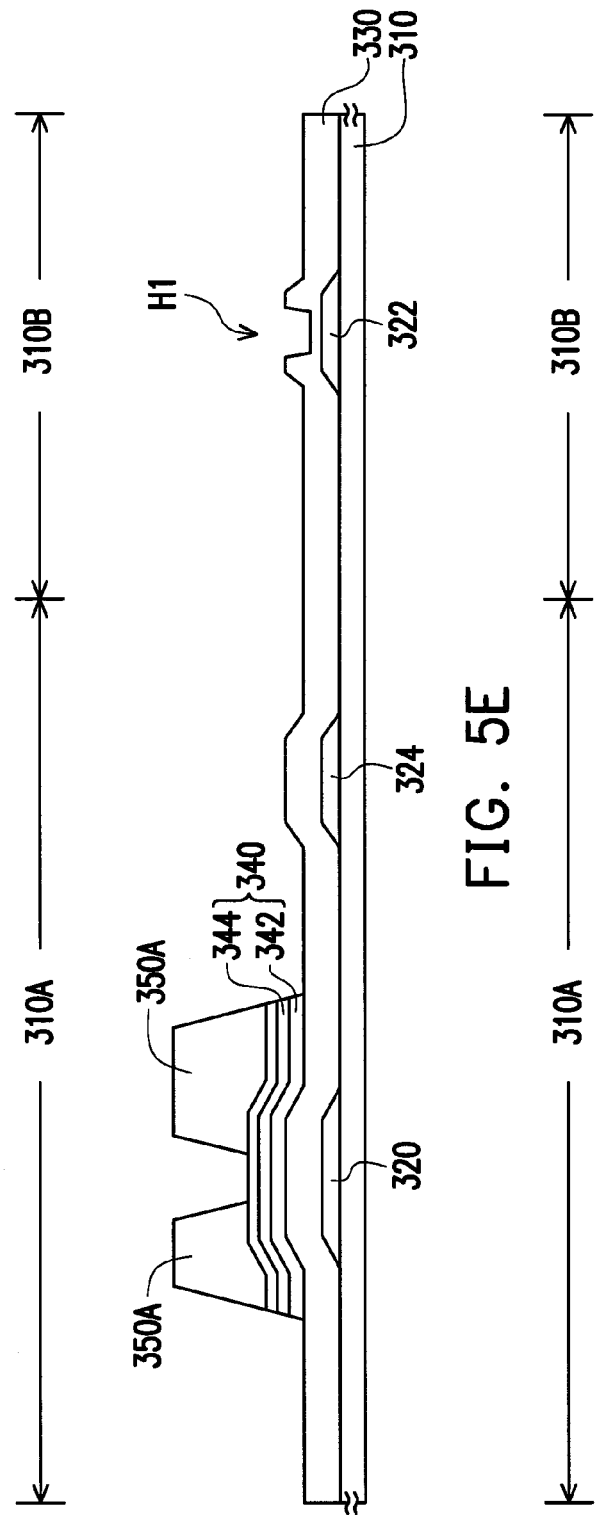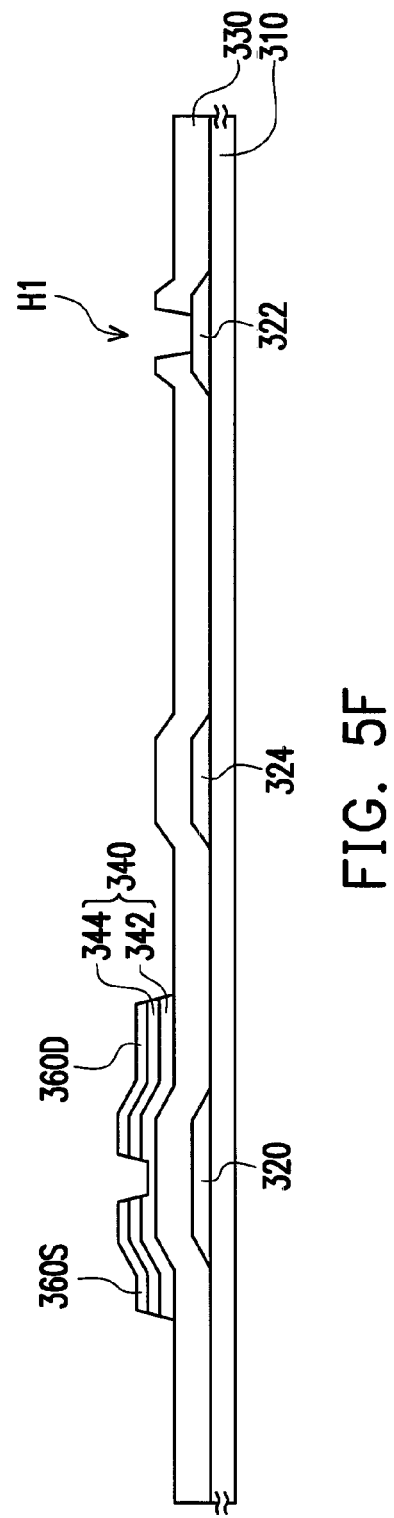

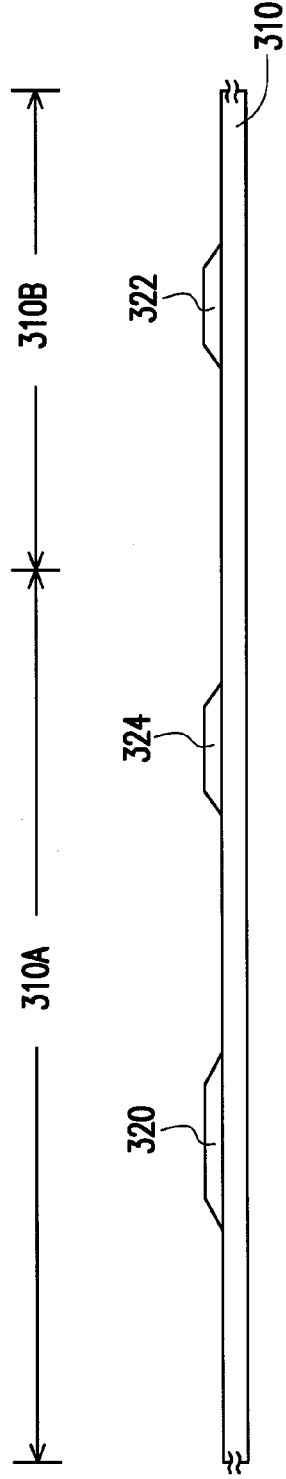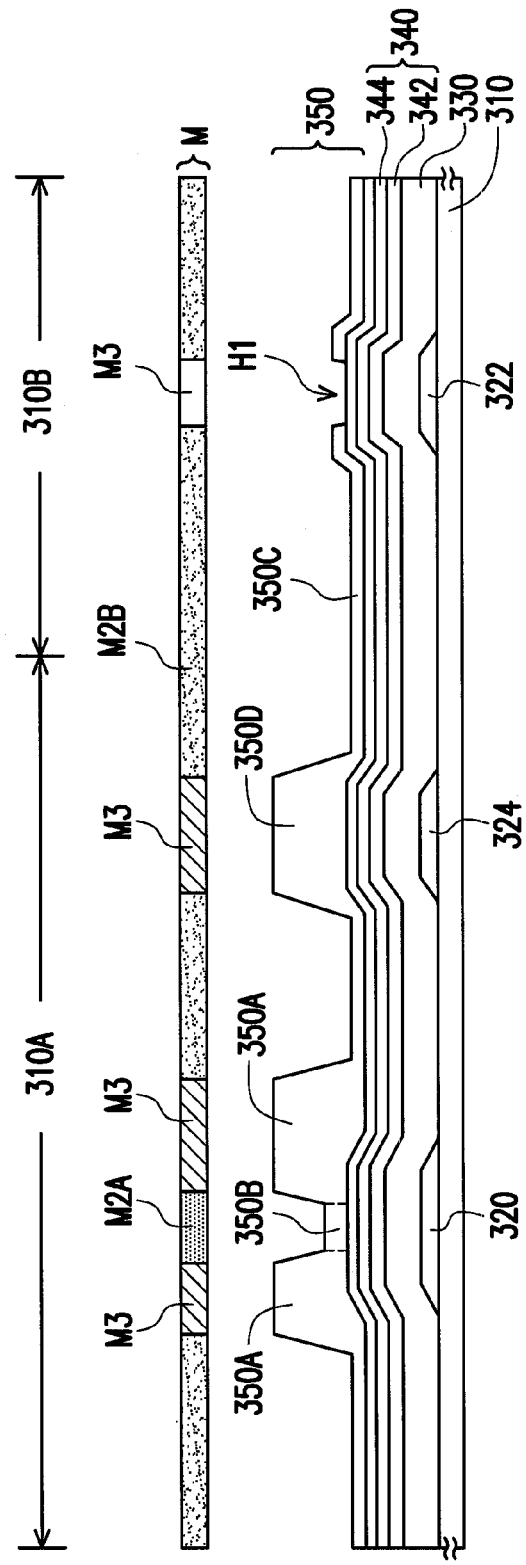
FIG. 6A
FIG. 6B

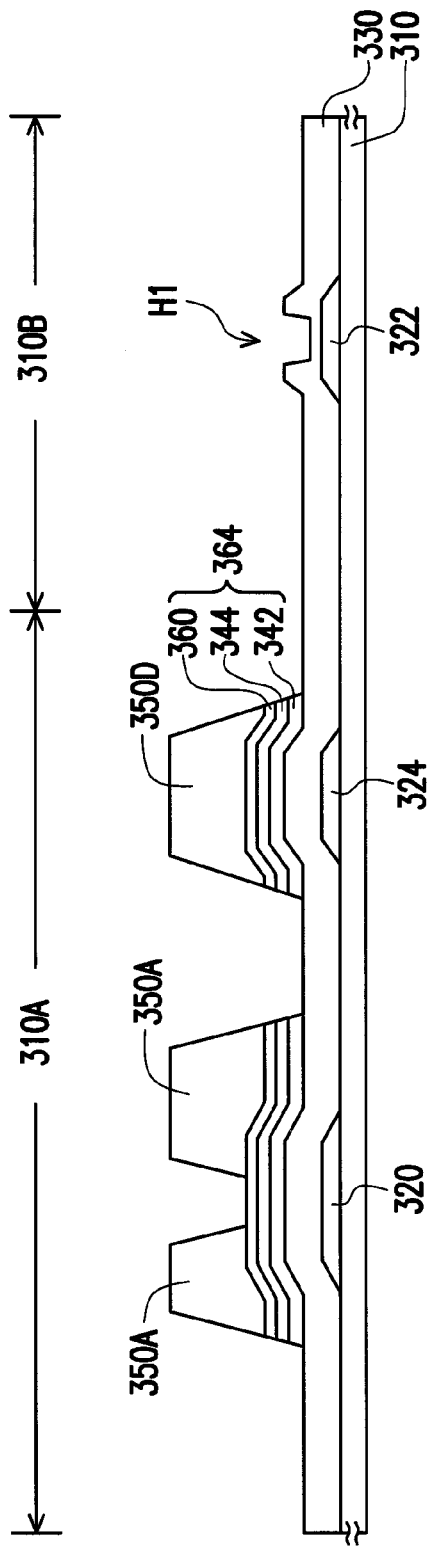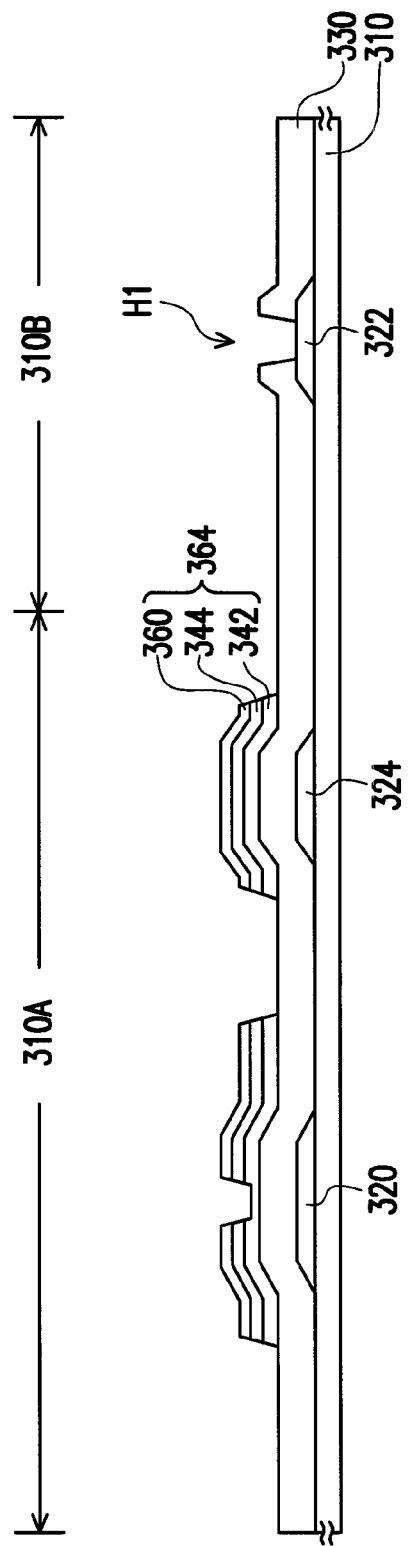

METHOD FOR FABRICATING THIN FILM TRANSISTOR ARRAY SUBSTRATE

CROSS-REFERENCE TO RELATED APPLICATION

This application is a divisional of patent application Ser. No. 12/356,090, filed on Jan. 20, 2009, now allowed, which claims the priority benefit of Taiwan application serial no. 97125980, filed on Jul. 9, 2008. The entirety of each of the above-mentioned patent applications is hereby incorporated by reference herein and made a part of this specification.

BACKGROUND OF THE INVENTION

1. Field of the Invention

The present invention relates to a method for fabricating an array substrate. More particularly, the present invention relates to a method for manufacturing a thin film transistor (TFT) array substrate.

2. Description of Related Art

In general, a thin film transistor liquid crystal display (TFT-LCD) is primarily composed of a TFT array substrate, a color filter substrate, a liquid crystal layer, and a backlight module. FIGS. 1A through 1F are flowcharts of a manufacturing process of a conventional TFT array substrate. In FIGS. 1A through 1F, only one set of pixels and pads is depicted for the purpose of explanation. As shown in FIG. 1A, a substrate 10 is provided at first, and a gate pattern 20, a first pad pattern 22, and a first electrode pattern 24 are formed on the substrate 10 with use of a first mask. Next, a gate insulation layer 30 and a semiconductor layer (not shown) are sequentially deposited on the substrate 10 for covering the gate pattern 20, the first pad pattern 22, and the first electrode pattern 24. After that, referring to FIG. 1B, a second mask is used for patterning the semiconductor layer, such that a channel layer 40 is formed on the gate insulation layer 30 above the corresponding gate pattern 20, and an ohmic contact layer 42 is selectively formed on the channel layer 40. Generally, a material of the channel layer 40 is amorphous silicon. Thereafter, referring to FIG. 1C, a third mask is used for forming a source pattern 50 and a drain pattern 60 on the channel layer 40 at respective sides of the gate pattern 20. Besides, a second electrode pattern 64 is formed on the gate insulation layer 30 above the corresponding first electrode pattern 24. As indicated in FIG. 1C, the ohmic contact layer 42 serves to reduce the contact resistance between the channel layer 40 and the source pattern 50 and between the channel layer 40 and the drain pattern 60. Additionally, the gate pattern 20, the channel layer 40, the source pattern 50, and the drain pattern 60 together constitute a TFT T, while the first electrode pattern 24, the gate insulation layer 30, and the second electrode pattern 64 together form a storage capacitor Cst having a metal-insulator-metal (MIM) structure.

After that, referring to FIG. 1D, a patterned passivation layer 70 is formed above the substrate 10. The patterned passivation layer 70 has a first opening H1, a second opening H2, and a third opening H3. The first opening H1 exposes a portion of the drain pattern 60. The second opening H2 and the third opening H3 respectively expose a portion of the gate insulation layer 30 above the corresponding first pad pattern 22 and a portion of the second electrode pattern 64.

Next, referring to FIG. 1E, an etching process is performed to remove the gate insulation layer 30 exposed by the second opening H2. As indicated in FIG. 1F, a fifth mask is then used to form a pixel electrode 80 and a second pad pattern 82 on the patterned passivation layer 70. It can be observed from FIG. 1F that the pixel electrode 80 is electrically connected to the drain pattern 60 through the first opening H1 and electrically connected to the second electrode pattern 64 through the third opening H3. The second pad pattern 82 is electrically connected to the first pad pattern 22 through the second opening H2. After the pixel electrode 80 and the second pad pattern 82 are entirely formed, the fabrication of a TFT array substrate 100 is completed.

However, referring to FIG. 1E, when a dry etching process is performed for removing the gate insulation layer 30 exposed by the second opening H2, an undercut effect is prone to occur in the gate insulation layer 30 around the second opening H2 as indicated in FIG. 1F'. Thereby, when a deposition process is subsequently performed, the second pad pattern 82 is likely to be disconnected to the first pad pattern 22, and signal transmission therebetween is negatively affected. On the other hand, when the gate insulation layer 30 within the second opening H2 is removed by performing the dry etching process, it is likely for an etching reaction gas to form unexpected by-products deposited at the first opening H1, thus posing an impact on the contact between the pixel electrode 80 and the drain pattern 60. Thereby, the contact resistance between the pixel electrode 80 and the drain pattern 60 is excessively high, or the signal transmission between the pixel electrode 80 and the drain pattern 60 fails because of the disconnection therebetween.

Moreover, when the gate insulation layer 30 above the first pad pattern 22 is removed by performing the dry etching process, high energy particles generated by plasma bombard a surface of the patterned passivation layer 70, such that the surface of the patterned passivation layer 70 is roughened, and a thickness of the patterned passivation layer 70 is reduced as well. Said phenomenon becomes worst when the patterned passivation layer 70 is made of an organic insulation material. As such, the overly roughened patterned passivation layer 70 having an uneven thickness deteriorates the performance of light transmission, thus giving rise to a mura effect and reducing a display quality of the TFT-LCD.

To resolve said issue, a conventional solution is proposed to perform an additional treatment step similar to a stripping process after the gate insulation layer 30 exposed by the second opening H2 is etched, so as to enhance the flatness of the patterned passivation layer 70. However, said additional treatment step relatively prolongs the fabrication of the TFT array substrate, results in a reduction of production, and brings about an increase in manufacturing costs.

FIGS. 2D through 2G are flowcharts of certain steps in a manufacturing process of another conventional TFT array substrate. A TFT array substrate 200 includes a storage capacitor Cst having a metal-insulator-ITO (MII) structure and comprising the first electrode pattern 24, the gate insulation layer 30, and the pixel electrode 80. The front-end manufacturing process of the TFT array substrate 200 is similar to that depicted in FIGS. 1A through 1C, while the back-end manufacturing process of the TFT array substrate 200 is illustrated in FIGS. 2D through 2G. As indicated in FIG. 2D, when the patterned passivation layer 70 is formed, not only the first opening H1 and the second opening H2 are formed with use of a half-tone mask, but also a first resist block 70A and a second resist block 70B with different thicknesses are formed above the first electrode pattern 24. Next, as shown in FIG. 2E, the gate insulation layer 30 within the second opening H2 is removed. Thereafter, as indicated in FIG. 2F, an ashing process is performed to remove the first resist block 70A having a relatively thin thickness, and a portion of the gate insulation layer 30 is exposed. After the implementation of the ashing process, a surface treatment step is performed on the patterned passivation layer 70 and a portion of the gate insulation layer 30. Here, the surface treatment step is often carried out by means of chemicals, e.g., a photoresist-striping liquid. With reference to FIG. 2G, the pixel electrode 80 and the second pad pattern 82 are then formed. Thereby, the first electrode pattern 24, the gate insulation layer 30, and the pixel electrode 80 in the TFT array substrate 200 together form the storage capacitor Cst having the MII structure.

Based on the above, in the process of manufacturing the TFT array substrate in which the storage capacitor has the M11 structure, one half-tone mask is required, and the ashing process is thereby necessitated for removing the relatively thin first resist block 70A in the passivation layer. Accordingly, the fabrication of the TFT array substrate is also prolonged, and the manufacturing costs of the TFT array substrate are increased as well.

SUMMARY OF THE INVENTION

The present invention is directed to a method for fabricating a TFT to rectify defects regarding a roughened surface of a passivation layer, unfavorable uniformity of the passivation layer, a formation of by-products during the manufacturing process of the TFT, and so on.

The present invention provides a method for fabricating a TFT array substrate. The method includes following steps. First, a substrate is provided. The substrate has a pixel region and a peripheral circuit region surrounding the pixel region. Next, a gate pattern is formed on the substrate in the pixel region, and a first pad pattern is formed on the substrate in the peripheral circuit region. A gate insulation layer and a semiconductor layer are then sequentially formed on the substrate for covering the gate pattern and the first pad pattern. After that, a patterned photoresist layer is formed on the semiconductor layer. The patterned photoresist layer has a first resist block and a second resist block. The first resist block is disposed above the corresponding gate pattern. The second resist block has a plurality of first openings and corresponds to regions on which the gate pattern is not formed. The first opening is disposed above the first pad pattern, and a thickness of the first resist block is greater than a thickness of the second resist block. Next, an etching process is performed with use of the patterned photoresist layer as a mask for removing the semiconductor layer and a portion of the gate insulation layer corresponding to the first opening. A thickness of the patterned photoresist layer is then reduced until the second resist block is removed. Afterwards, an etching process is implemented with use of the remaining patterned photoresist layer as the mask for removing the exposed semiconductor layer and the gate insulation layer corresponding to the first opening. The remaining patterned photoresist layer is then removed. Next, a source pattern and a drain pattern are respectively formed on the semiconductor layer within the pixel region. The source pattern and the drain pattern are respectively disposed at respective sides of the gate pattern. Meanwhile, a second pad pattern is formed in the peripheral circuit region, and the second pad pattern is electrically connected to the corresponding first pad pattern through the first opening. A patterned passivation layer is then formed on the gate insulation layer for covering the source pattern, the drain pattern, and a portion of the second pad pattern. The patterned passivation layer has a second opening in the pixel region. The second opening exposes the corresponding source pattern or the corresponding drain pattern. Besides, the patterned passivation layer has a third opening in the peripheral circuit region, and the third opening exposes the second pad pattern.

In an embodiment of the present invention, before the gate insulation layer and the semiconductor layer are formed on the substrate, the method for fabricating the TFT array substrate further includes forming an electrode pattern on the substrate within the pixel region. Besides, the method for fabricating the TFT array substrate further comprising forming a pixel electrode on the patterned passivation layer within the pixel region after the patterned passivation layer is form. Here, the source pattern or the drain pattern electrically connected to the pixel electrode can extend above the corresponding electrode pattern, and the second opening within the pixel region is positioned above the corresponding electrode pattern. Additionally, the patterned passivation layer further has a fourth opening in the pixel region. The fourth opening exposes the gate insulation layer above the corresponding electrode pattern. Through the corresponding fourth opening, the pixel electrodes is connected to the gate insulation layer exposed by the fourth opening.

In an embodiment of the present invention, the method for fabricating the TFT array substrate further includes respectively forming a pixel electrode on the patterned passivation layer within each of the pixel region. In the meantime, a plurality of third pad pattern is formed on the patterned passivation layer in the peripheral circuit region. Through the corresponding second opening, the pixel electrode is electrically connected to the source pattern or the drain pattern exposed by the corresponding second opening. Besides, the third pad pattern is electrically connected to the corresponding second pad pattern through the third opening.

The present invention further provides a method for fabricating a TFT array substrate. The method includes following steps. First, a substrate is provided. The substrate has a pixel region arranged in array and a peripheral circuit region surrounding the pixel region. Next, a gate pattern is formed on the substrate in the pixel region, and a first pad pattern is formed on the substrate in the peripheral circuit region. A gate insulation layer, a semiconductor layer, and a metal layer are then sequentially formed on the substrate for covering the gate pattern and the first pad pattern. After that, a patterned photoresist layer is formed on the metal layer. The patterned photoresist layer includes a first resist block, a second resist block, and a third resist block. The first resist block and the second resist block are located above the gate pattern. The first resist block within the pixel region is disposed at opposite sides of the corresponding second resist block. The third resist block has a first opening and corresponds to regions on which the gate pattern are not formed. The first opening is positioned above the first pad pattern. A thickness of the first resist block is greater than a thickness of the second resist block, and the thickness of the second resist block is greater than a thickness of the third resist block. Next, an etching process is performed with use of the patterned photoresist layer as a mask for removing the metal layer, the semiconductor layer, and a portion of the gate insulation layer corresponding to the first opening. A thickness of the patterned photoresist layer is then reduced until the third resist block is removed to form a first remaining patterned photoresist layer.

After the removal of the third resist block, the etching process is performed with use of the first remaining patterned photoresist layer as the mask, so as to remove the exposed metal layer and the semiconductor layer. The thickness of the patterned photoresist layer is then reduced until the second resist block is removed to form a second remaining patterned photoresist layer. After that, an etching process is performed with use of the second remaining patterned photoresist layer as the mask for removing the exposed metal layer, a portion of the semiconductor layer, and the gate insulation layer corresponding to the first opening, so as to form a source pattern and a drain pattern respectively at opposite sides of the gate pattern within the pixel region. The second remaining patterned photoresist layer is then removed. Next, a patterned passivation layer is formed on the gate insulation layer for covering the source pattern and the drain pattern. The patterned passivation layer has a second opening in the pixel regions. The second opening exposes the corresponding source pattern or the corresponding drain pattern. Besides, the patterned passivation layer has a third opening in the peripheral circuit region, and the third opening exposes the first pad pattern. Afterwards, a pixel electrode is formed on the patterned passivation layer within the pixel regions, and a second pad pattern is formed on the patterned passivation layer within the peripheral circuit region. Through the corresponding second opening, the pixel electrode is electrically connected to the source pattern or the drain pattern exposed by the corresponding second opening, and the second pad pattern is electrically connected to the corresponding first pad pattern through the third opening.

In an embodiment of the present invention, before the gate insulation layer and the semiconductor layer are formed on the substrate, the method for fabricating the TFT array substrate further includes forming a first electrode pattern on the substrate within the pixel region. In addition, the patterned passivation layer further has a fourth opening in the pixel region. The fourth opening exposes the gate insulation layer above the corresponding first electrode pattern. Through the corresponding fourth opening, the pixel electrodes is connected to the gate insulation layer exposed by the fourth opening. Moreover, the patterned photoresist layer can selectively have a fourth resist block positioned above the first electrode pattern, and a thickness of the fourth resist block is substantially equal to the thickness of the first resist block. Besides, the method for fabricating the TFT array substrate further includes etching the metal layer and the semiconductor layer with use of the fourth resist block as the mask and forming second electrode pattern above the first electrode pattern. The patterned passivation layer has a fourth opening in the pixel region. The fourth opening exposes the corresponding second electrode pattern. Through the corresponding fourth opening, the pixel electrode is connected to the second electrode pattern exposed by the fourth opening.

In an embodiment of the present invention, a material of the patterned passivation layer is an organic insulation material.

In an embodiment of the present invention, a method of forming the patterned photoresist layer on the semiconductor layer includes following steps. First, a photoresist material layer is formed on the semiconductor layer. Next, the photoresist material layer is patterned with use of a half-tone mask or a gray-tone mask, so as to simultaneously form the first resist block, the second resist block, and the first opening.

In an embodiment of the present invention, a method of reducing the thickness of the patterned photoresist layer includes performing an ashing process.

In an embodiment of the present invention, the semiconductor layer includes a channel layer and an ohmic contact layer disposed on the channel layer. In an embodiment of the present invention, a portion of the channel layer and the ohmic contact layer exposed by the source patterns and the drain patterns are removed when the source pattern and the drain pattern are formed. In the present invention, the gate insulation layer covering the first pad pattern is removed during the process of patterning the semiconductor layer and the metal layer.

During the process of patterning the semiconductor layer, the removal of the gate insulation layer begins according to the method for fabricating the TFT array substrate in the present invention. Thereby, the etching process implemented on the passivation layer can be omitted, and the issues regarding the roughened surface of the passivation layer, the unfavorable uniformity of the passivation layer, and the poor contact caused by the occurrence of the undercut effect or the formation of the by-products can be resolved. As such, the display quality is improved. Moreover, the ashing process performed for fabricating the storage capacitor having the MII structure and the treatment step performed after the implementation of the etching process in the conventional manufacturing method of the TFT array substrate are both omitted in the present invention, thus simplifying the manufacturing process of the present invention, reducing the manufacturing costs, and improving manufacturing yield.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A through 1F are flowcharts of a manufacturing process of a conventional TFT array substrate.

FIG. 1F' is a schematic view of a conventional TFT array substrate in which a second pad pattern is disconnected to a first pad pattern.

FIGS. 2D through 2G are flowcharts of certain steps in a manufacturing process of another conventional TFT array substrate.

FIGS. 3A through 3H are schematic flowcharts of a fabricating process of a TFT array substrate according to a first embodiment of the present invention.

FIGS. 4A through 4H are schematic flowcharts of a fabricating process of another TFT array substrate according to a second embodiment of the present invention.

FIGS. 5A through 5H are schematic flowcharts of a fabricating process of a TFT array substrate according to a third embodiment of the present invention.

FIGS. 6A through 6H are schematic flowcharts of a fabricating process of another TFT array substrate according to a fourth embodiment of the present invention.

DESCRIPTION OF EMBODIMENTS

In a method for manufacturing a conventional TFT array substrate, an etching process is required for removing a gate insulation layer above pads after a passivation layer is formed. The etching process performed on the passivation layer not only causes damages to a surface of the passivation layer but also results in a formation of unnecessary by-products or other issues. Based on the above, a method for manufacturing a TFT array substrate as proposed in the present invention requires no etching process performed on the passivation layer after the passivation layer is formed, and thereby conventional issues caused by etching the passivation layer can be effectively resolved.

In addition, the method proposed in the present invention can effectively prevent the passivation layer from being negatively affected by the etching process subsequently performed on the gate insulation layer, so as to equip the TFT array substrate with improved characteristics and manufacturing yield. Further, a favorable display quality can be achieved by a TFT-LCD to which said TFT array substrate is applied. Several methods for fabricating the TFT array substrate are elaborated hereinafter to exemplify the present invention.

First Embodiment

Figure 1F:
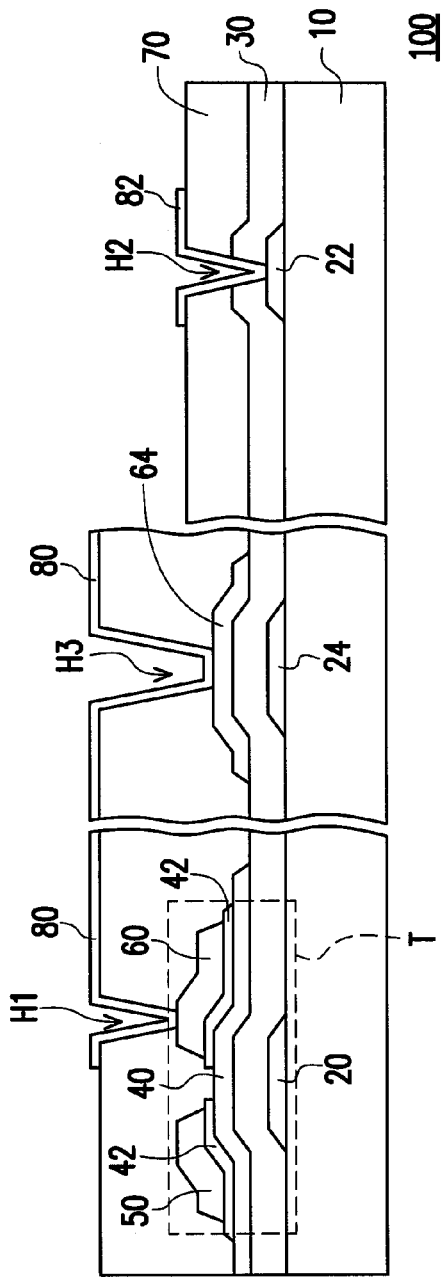
Figure 1F:
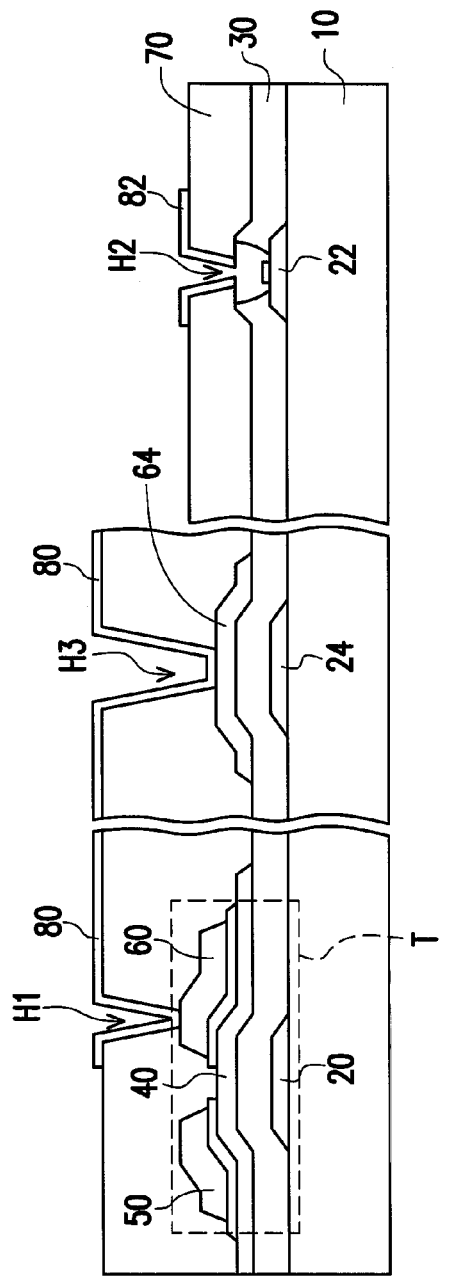
Figure 3E:
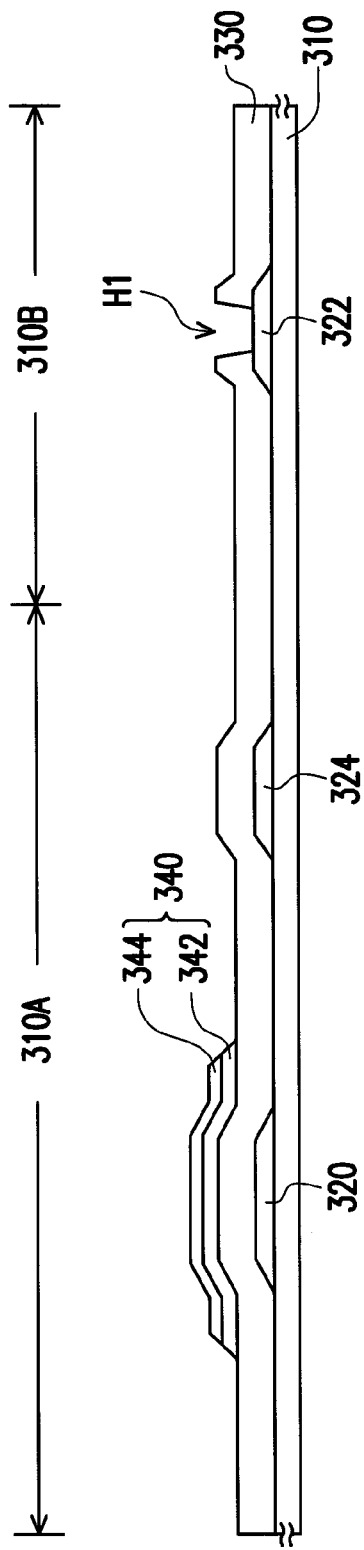

FIGS. 3A through 3H are schematic flowcharts of a fabricating process of a TFT array substrate according to a first embodiment of the present invention. Referring to FIG. 3A, a substrate 310 having a plurality of pixel regions 310A arranged in array and a peripheral region 310B is provided at first. Here, only one pixel region 310A is depicted for better describing the following embodiments. The substrate 310 is, for example, a transparent substrate made of glass, quartz, or plastic. Next, a gate pattern 320 is respectively formed on the substrate 310 in each of the pixel regions 310A, and a plurality of first pad patterns 322 are formed on the substrate 310 in the peripheral circuit region 310B. A method of forming the gate patterns 320 and the first pad patterns 322 includes, for example, first forming a first metal layer (not shown) on the substrate 310 and patterning the first metal layer (not shown), such that the gate patterns 320 and the first pad patterns 322 are formed. In addition, the first metal layer is formed by performing a sputtering process, an evaporation process, or other thin film deposition processes, for example. Besides, the first metal layer is patterned by performing a photolithography and etching process, for example. In the present embodiment, an electrode pattern 324 is selectively formed on the substrate 310 in each of the pixel regions 310A during the formation of the gate patterns 320 and the first pad patterns 322.

Next, as shown in FIG. 3B, a gate insulation layer 330 and a semiconductor layer 340 are sequentially formed on the substrate 310 for covering the gate patterns 320, the first pad patterns 322, and the electrode patterns 324. Here, a material of the gate insulation layer 330 is, for example, a dielectric material including silicon oxide, silicon nitride, silicon oxynitride, or a stacked layer thereof. A method of forming the gate insulation layer 330 includes performing a chemical vapor deposition (CVD) process or other appropriate thin film deposition processes, for example. Moreover, in the present embodiment, the semiconductor layer 340 includes a channel layer 342 and an ohmic contact layer 344 disposed on the channel layer 342. The channel layer 342 and the ohmic contact layer 344 are respectively made of amorphous silicon and an N-type heavily-doped amorphous silicon, for example, and these two layers are formed by performing the CVD process, for example.

After that, referring to FIG. 3B, a patterned photoresist layer 350 is formed on the semiconductor layer 340. The patterned photoresist layer 350 is mainly composed of a first resist block 350A and a second resist block 350B. The first resist block 350A is disposed above the corresponding gate patterns 320. The second resist block 350B has a plurality of first openings H1 and corresponds to regions on which the gate patterns 320 are not formed. The first openings H1 are positioned above the first pad patterns 322, and a thickness of the first resist block 350A is greater than a thickness of the second resist block 350B. The patterned photoresist layer 350 is formed by coating a material layer on the semiconductor layer 340 through spin coating, slit/spin coating, or spin-less coating, for example. The material layer is usually photosensitive. After an exposure process is performed on the material layer with use of a half-tone mask M or a gray-tone mask M having regions with different light transmittance rates, a development process and a hard baking process are carried out, so as to simultaneously form the first resist block 350A, the second resist block 350B, and the first openings H1. Specifically, the half-tone mask M includes a transparent region M3 having a transmittance rate of 100% and corresponding to the first openings H1, a non-transparent region M1 having a transmittance rate of 0% and corresponding to the first resist block 350A, and a semitransparent region M2 having a transmittance rate of 20%~50% and corresponding to the second resist block 350B, for example. It is certain that the light transmittance rates of the transparent region M3, the semitransparent region M2, and the non-transparent region M1 in the mask M used for forming the patterned photoresist layer 350 merely denote the relative light transmittance rates which should not be interpreted as the absolute light transmittance rates and should not be construed as limited to the embodiments of the present invention.

Thereafter, as depicted in FIG. 3C, an etching process is performed with use of the patterned photoresist layer 350 as a mask for removing the semiconductor layer 340 and a portion of the gate insulation layer 330 corresponding to the first openings H1. Here, the etching process is, for example, a dry etching process. As shown in FIG. 3D, a thickness of the patterned photoresist layer 350 is then reduced by, for example, performing an ashing process with use of oxygen plasma until the second resist block 350B is removed. After that, the etching process is performed with use of the remaining patterned photoresist layer 350 (e.g., the first resist block 350A) as the mask for removing the exposed semiconductor layer 340 and the gate insulation layer 330 corresponding to the first openings H1. The remaining patterned photoresist layer 350 is then removed as indicated in FIG. 3E.

Different from the conventional technology, the present invention teaches removing the gate insulation layer 330 covering the first pad patterns 322 in the process of patterning the semiconductor layer 340. As such, the etching process performed on the gate insulation layer 330 after the formation of a passivation layer 370 (depicted in FIG. 3G) is no longer required, so as to prevent the passivation layer 370 from being damaged in the subsequent etching process.

Figure 3F:
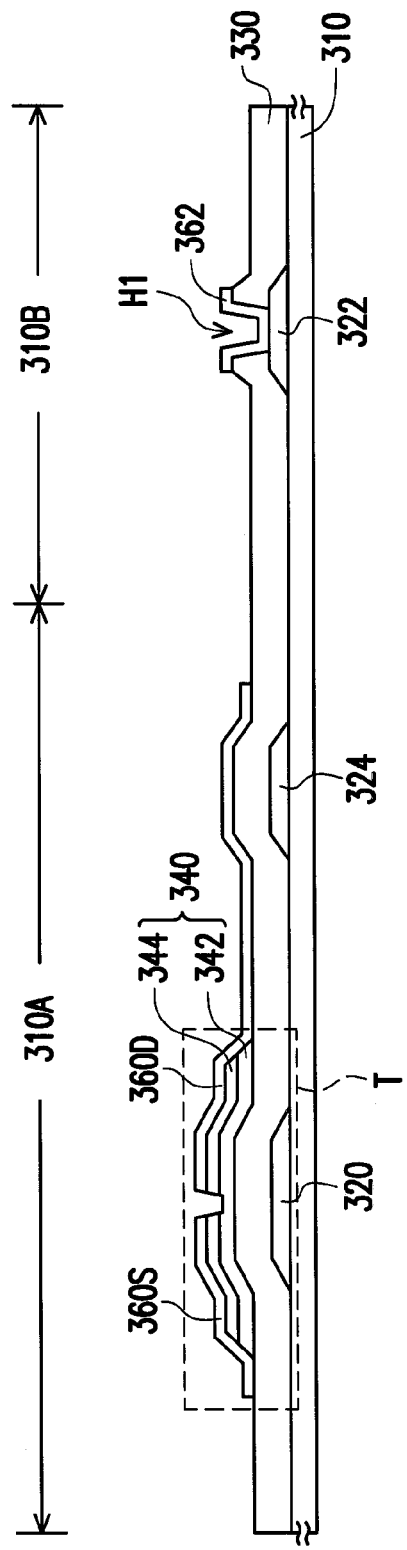

Next, as indicated in FIG. 3F, a source pattern 360S and a drain pattern 360D are respectively formed on the semiconductor layer 340 within each of the pixel regions 310A. The source pattern 360S and the drain pattern 360D are respectively disposed at respective sides of the gate pattern 320, and the gate pattern 320, the channel layer 342, the source pattern 360S, and the drain pattern 360D together constitute a TFT T. Meanwhile, a plurality of second pad patterns 362 are formed in the peripheral circuit region 310B, and the second pad patterns 362 are electrically connected to the corresponding first pad patterns 322 through the first openings H1, respectively. In the present embodiment, the ohmic contact layer 344 serves to reduce the contact resistance between the channel layer 342 and the source pattern 360S and between the channel layer 342 and the drain pattern 360D, such that the ohmic contact layer 344 disposed above the channel layer 342 would not cause short circuit between the source pattern 360S and the drain pattern 360D and would not affect device characteristics of the TFT T. Thus, during the formation of the source pattern 360S and the drain pattern 360D, the ohmic contact layer 344 exposed by the source pattern 360S and the drain pattern 360D is also removed.

In addition, referring to FIG. 3F, the drain pattern 360D extends above the corresponding electrode pattern 324 in the present embodiment, such that the electrode pattern 324, the gate insulation layer 330, and a portion of the drain pattern 360D together constitute a storage capacitor having a MIM structure. It is certain that the pattern extending above the electrode pattern 324 can also be referred to as the source pattern 360S, which is not limited in the present invention.

Thereafter, in FIG. 3G, a patterned passivation layer 370 is formed on the gate insulation layer 330 for covering the source pattern 360S, the drain pattern 360D, and a portion of the second pad pattern 362. The patterned passivation layer 370 has a second opening H2 in each of the pixel regions 310A. The second openings H2 expose the corresponding drain patterns 360D. It is for sure that the second openings H2 can also expose the corresponding source patterns 360S in other types of the TFTs T. In the present embodiment, the second openings H2 are positioned above the corresponding electrode patterns 324. The patterned passivation layer 370 has a plurality of third openings H3 in the peripheral circuit region 310B. The third openings H3 respectively expose the second pad patterns 362. Here, the patterned passivation layer 370 can be made of an organic insulation material that is often photo-sensitive, such as acrylic resin, and so on. Besides, the patterned passivation layer 370 is usually formed by first performing the spin coating process and then implementing the soft baking process, the exposure process, the development process, and the hard baking process.

Note that the second openings H2 and the third openings H3 in the patterned passivation layer 370 are merely formed by performing the photolithography process. Moreover, the third openings H3 directly expose the second pad patterns 362, and therefore it is not necessary to etch the gate insulation layer 330. Thereby, issues regarding a roughened surface of the patterned passivation layer 370, unfavorable uniformity of the patterned passivation layer 370, and poor contact caused by occurrence of an undercut effect or a formation of unexpected by-products can be resolved. As such, the manufacturing yield of the TFT T is improved, the manufacturing process is simplified, and the manufacturing costs are reduced. On the other hand, the TFT-LCD to which the TFT array substrate is applied can be characterized by an improved display quality.

Afterwards, as shown in FIG. 3H, a pixel electrode 380 is respectively formed on the patterned passivation layer 370 within each of the pixel regions 310A, and a plurality of third pad patterns 382 are formed on the patterned passivation layer 370 within the peripheral circuit region 310B. Through the corresponding second opening H2, each of the pixel electrodes 380 is electrically connected to the drain pattern 360D exposed by the corresponding second opening H2, and the third pad patterns 382 are electrically connected to the corresponding second pad patterns 362 through the third openings H3, respectively. A method of forming the pixel electrodes 380 and the third pad patterns 382 includes, for example, first forming an electrode material layer (not shown) on the patterned passivation layer 370, the drain patterns 360D, and the second pad patterns 362. Next, the electrode material layer (not shown) is patterned. Here, the electrode material layer is, for example, made by forming an indium-tin-oxide (ITO) layer or an indium-zinc-oxide (IZO) layer through performing the sputtering process. It is for sure that each of the pixel electrodes 380 can also be electrically connected to the corresponding source pattern 360S in other types of the TFTs T, which is not limited in the present invention. So far, the fabrication of a TFT array substrate 300 is roughly completed.

Practically, in light of the above embodiment, the storage capacitor having the MIM structure can be replaced with the storage capacitor having an MII structure upon different actual product demands or in consideration of circuit layout, so as to increase the design margin and allow the TFT array substrate to be applied to a better extent. A manufacturing process of a TFT array substrate equipped with the storage capacitor having the MII structure is described hereinafter to exemplify the present invention.

Second Embodiment

Figure 4A:
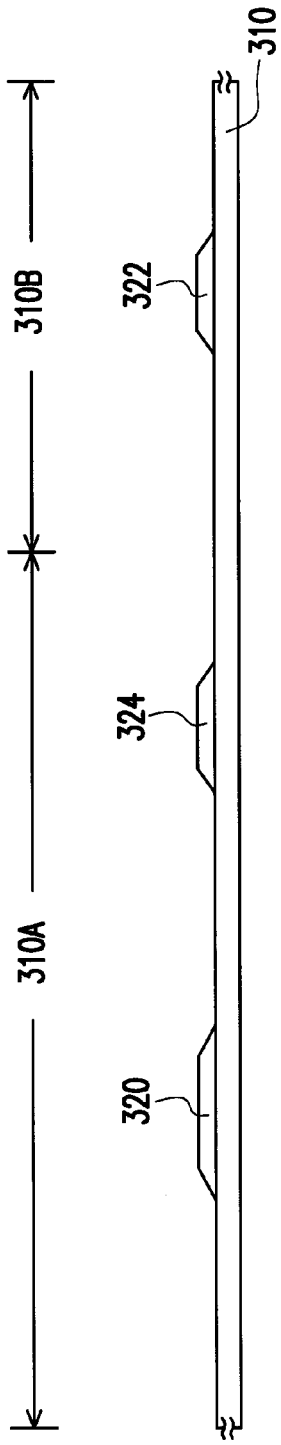
Figure 4B:
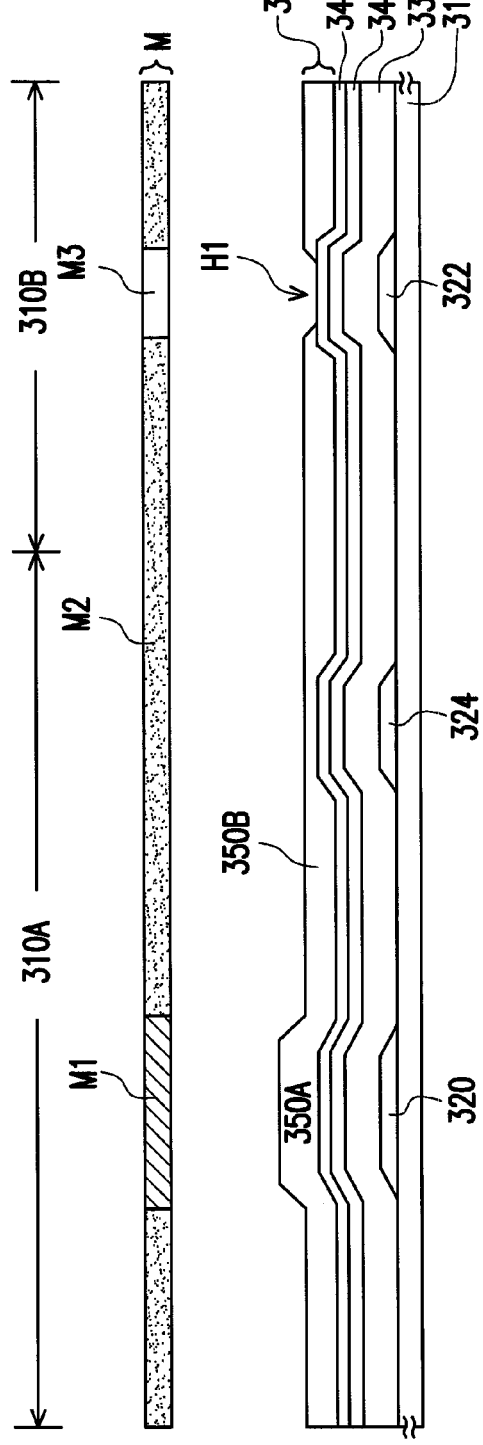
Figure 4C:
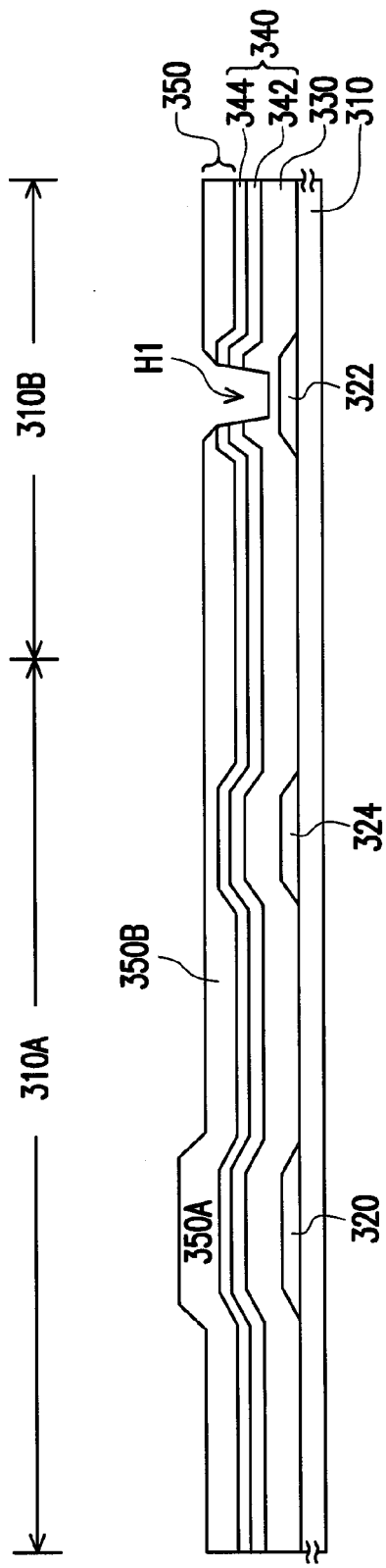
Figure 4D:
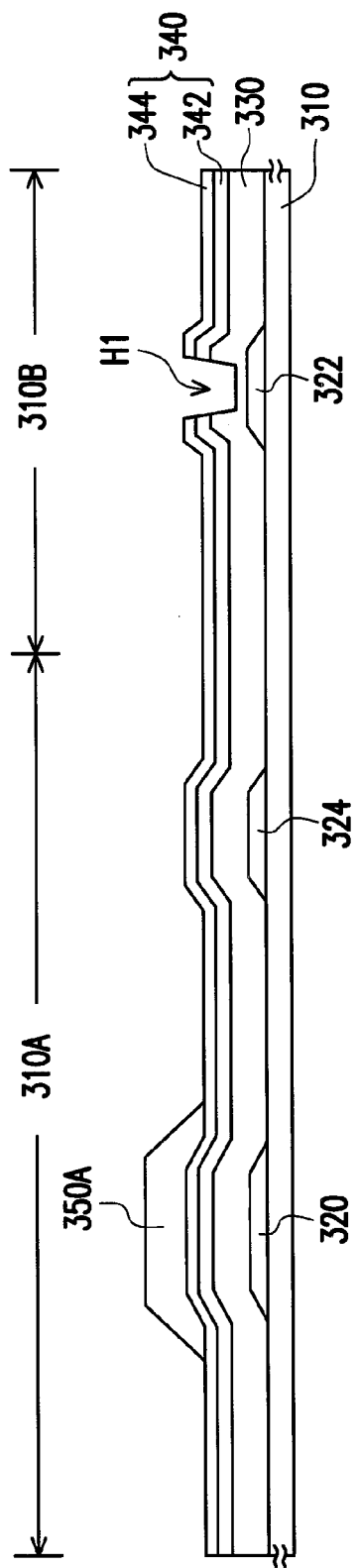
Figure 4G:
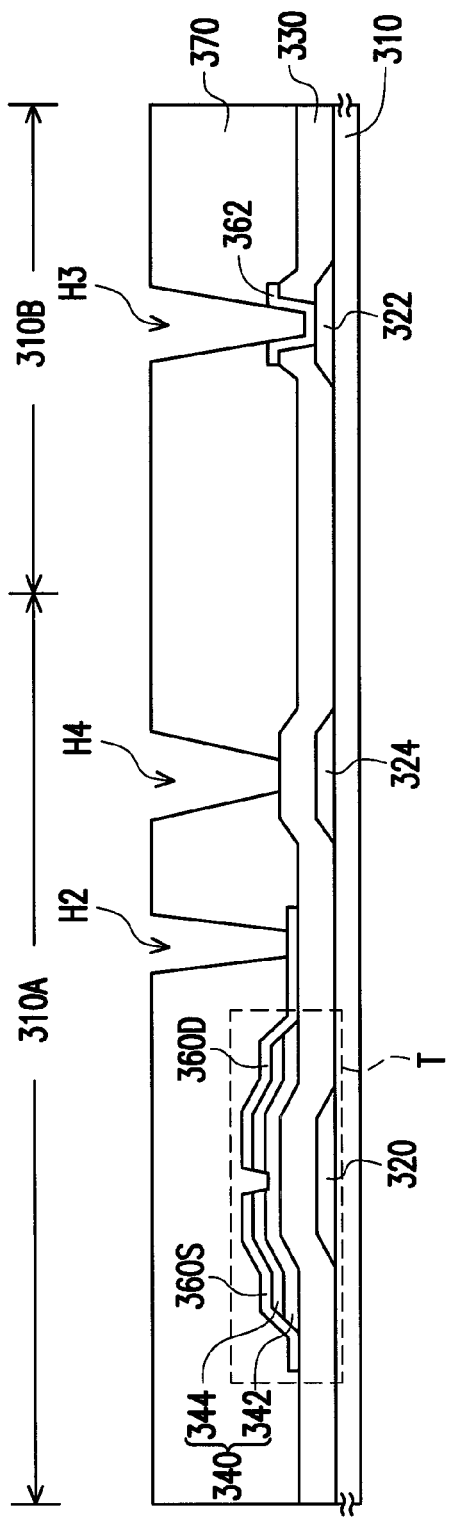
Figure 4H:
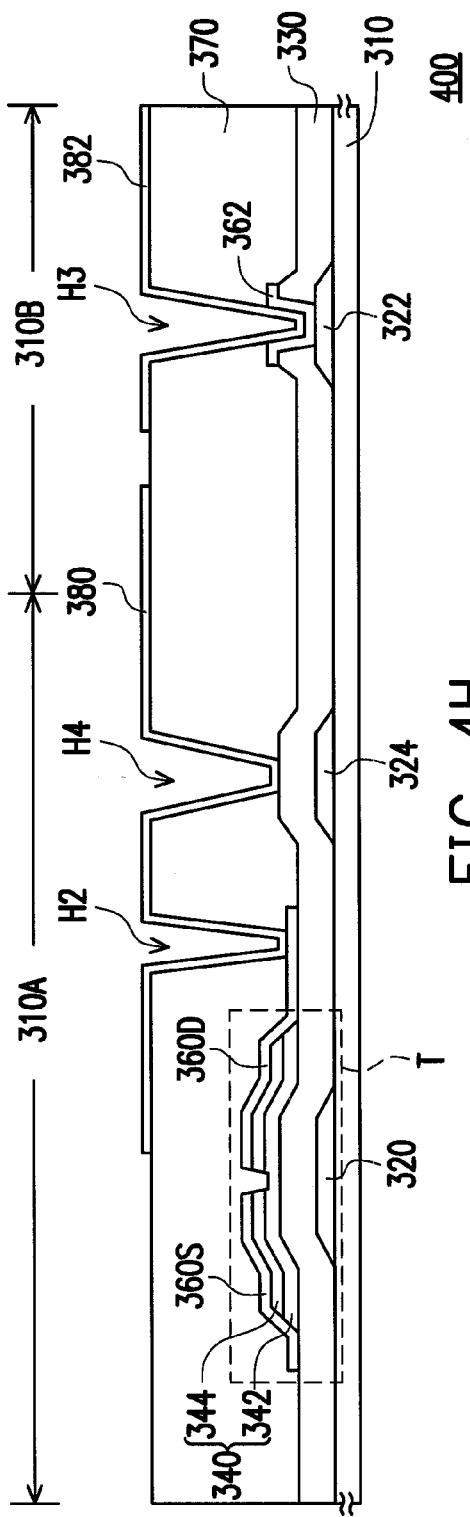

FIGS. 4A through 4H are schematic flowcharts of a fabricating process of another TFT array substrate according to a second embodiment of the present invention. The similar manufacturing steps depicted in FIGS. 3A through 3H are not described herein for the purpose of simplicity. As shown in FIG. 4F, compared with the first embodiment, the drain patterns 360D or the source patterns 360S do not extend above the electrode patterns 324 in the present embodiment. Next, as shown in FIG. 4G, the patterned passivation layer 370 further has a fourth opening H4 within each of the pixel regions 310A for exposing the gate insulation layer 330 above the corresponding electrode pattern 330. After that, as indicated in FIG. 4H, through the corresponding fourth opening H4, each of the pixel electrodes 380 is further connected to the gate insulation layer 330 exposed by the corresponding fourth opening H4 after the formation of the pixel electrodes 380 and the third pad patterns 382. Thereby, the electrode pattern 324, the gate insulation layer 330, and the pixel electrode 380 together form the storage capacitor having the MII structure.

In the previous embodiment, five masks are used for fabricating the TFT array substrate. However, it should be mentioned that the TFT array substrate can be fabricated by means of four masks according to the present invention, which is enumerated hereinafter.

Third Embodiment

Figure 5A:
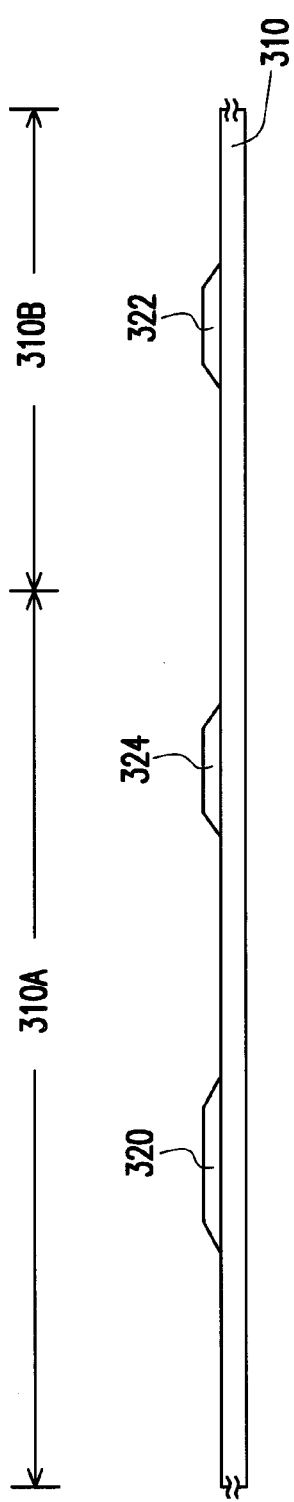
Figure 5B:
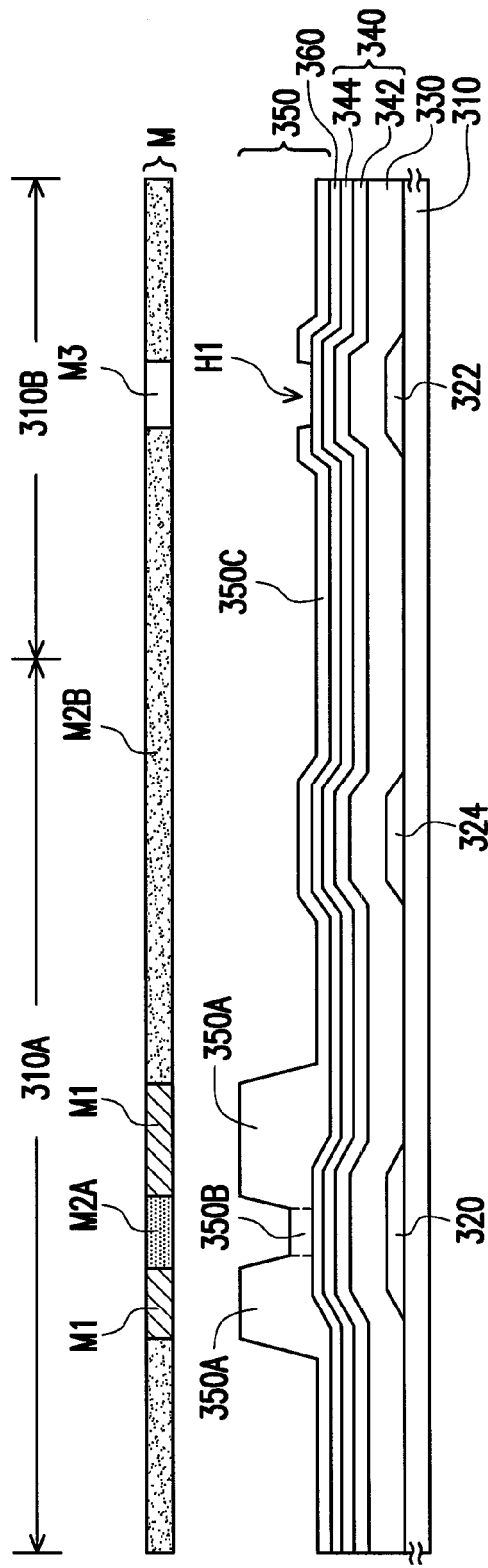

FIGS. 5A through 5H are schematic flowcharts of a fabricating process of a TFT array substrate according to a third embodiment of the present invention. The fabricating process depicted in FIG. 5A is similar to that illustrated in FIG. 3A, while first electrode patterns 324 of the present embodiment are equivalent to the electrode patterns 324 of the first embodiment. As indicated in FIG. 5B, compared with the first embodiment, a metal layer 360 is also formed above the substrate 310 in the present embodiment after the gate insulation layer 330 and the semiconductor layer 340 are formed. The metal layer 360 covers each of the pixel regions 310A and the peripheral circuit region 310B, which means that the metal layer 360 covers the gate patterns 320 and the first pad patterns 322 as well. Here, the semiconductor layer 340 includes the channel layer 342 and the ohmic contact layer 344 disposed on the channel layer 342.

Thereafter, referring to FIG. 5B, the patterned photoresist layer 350 is formed on the metal layer 360. The patterned photoresist layer 350 is mainly composed of the first resist block 350A, the second resist block 350B, and a third resist block 350C. The first resist block 350A and the second resist block 350B are disposed above the corresponding gate patterns 320. The first resist block 350A in each of the pixel regions 310A is disposed at the opposite sides of the corresponding second resist block 350B. The third resist block 350C has a plurality of first openings H1 and corresponds to the regions on which the gate patterns 320 are not formed. The first openings H1 are positioned above the first pad patterns 322. The thickness of the first resist block 350A is greater than the thickness of the second resist block 350B, and the thickness of the second resist block 350B is greater than a thickness of the third resist block 350C. In the present embodiment, the method for forming the patterned photoresist layer 350 is similar to that discussed in the previous embodiments. However, the half-tone mask M or the gray-tone mask M in the present embodiment includes the transparent region M3 having the transmittance rate of 100% and corresponding to one of the first openings H1, the non-transparent region M1 having the transmittance rate of 0% and corresponding to the first resist block 350A, a first semitransparent region M2A having a transmittance rate of 20%~60% and corresponding to the second resist block 350B, and a second semitransparent region M2B having a transmittance rate of 40%~80% and corresponding to the third resist block 350C. It is certain that the light transmittance rates of the transparent region M3, the first semitransparent region M2A, the second semitransparent region M2B, and the non-transparent region M1 in the mask M used for forming the patterned photoresist layer 350 merely denote the relative light transmittance rates which should not be interpreted as the absolute light transmittance rates and should not be construed as limited to the embodiments of the present invention.

Thereafter, in FIG. 5C, an etching process is performed with use of the patterned photoresist layer 350 as the mask for removing the metal layer 360, the semiconductor layer 340, and a portion of the gate insulation layer 330 corresponding to the first opening H1. Here, the etching process is, for example, the dry etching process, a wet etching process, or both of the two etching processes. As shown in FIG. 5D, the thickness of the patterned photoresist layer 350 is then reduced by, for example, performing the ashing process with use of the oxygen plasma until the third resist block 350C is removed to form a first remaining patterned photoresist layer. After that, another etching process is performed with use of the first remaining patterned photoresist layer 350 (e.g., the first resist block 350A and the second resist block 350B) as the mask, so as to remove the exposed metal layer 360 and the semiconductor layer 340. Next, as indicated in FIG. 5E, the thickness of the first remaining patterned photoresist layer 350 is reduced until the second resist block 350B is removed to form a second remaining patterned photoresist layer.

Afterwards, in FIG. 5F, the etching process is performed with use of the second remaining patterned photoresist layer 350 (e.g., the first resist block 350A) as the mask for removing the exposed metal layer 360, a portion of the semiconductor layer 340, and the gate insulation layer 330 corresponding to the first opening H1, so as to form the source pattern 360S and the drain pattern 360D respectively at the opposite sides of the gate pattern 320 within each of the pixel regions 310A. In detail, according to the present embodiment, the ohmic contact layer 344 and a portion of the channel layer 342 exposed by the source patterns 360S and the drain patterns 360D are further removed during the formation of the source patterns 360S and the drain patterns 360D, such that the ohmic contact layer 344 is capable of reducing the contact resistance between the channel layer 342 and the source patterns 360S and between the channel layer 342 and the drain patterns 360D and guaranteeing the device characteristics of the TFT T. Next, the second remaining patterned photoresist layer 350 is removed.

Figure 5G:
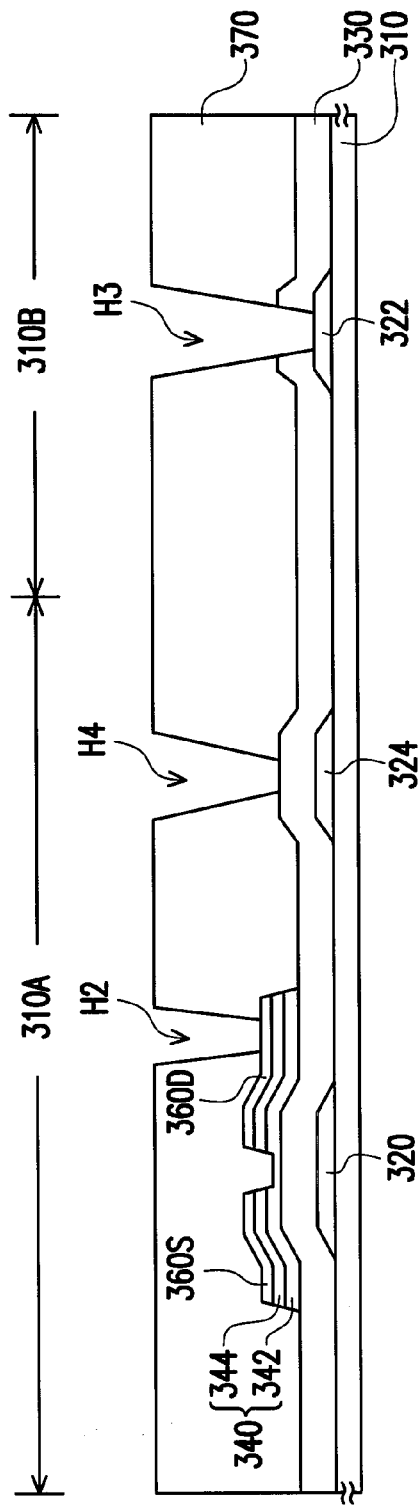

Next, as shown in FIG. 5G, the patterned passivation layer 370 is formed on the gate insulation layer 330. The patterned passivation layer 370 covers each of the pixel regions 310A and the peripheral circuit region 310B, which means that the patterned passivation layer 370 covers the source patterns 360S and the drain patterns 360D as well. The patterned passivation layer 370 has a second opening H2 in each of the pixel regions 310A. The second openings H2 expose the corresponding source patterns 360S or the corresponding drain patterns 360D. Besides, the patterned passivation layer 370 has a plurality of third openings H3 in the peripheral circuit region 310B, and the third openings H3 respectively expose the first pad patterns 322. In the present embodiment, the patterned passivation layer 370 further has the fourth opening H4 in each of the pixel regions 310A, and the fourth openings H4 expose the gate insulation layer 330 above the corresponding first electrode patterns 330. The material and the fabricating method of the patterned passivation layer 370 are similar to those described in the first embodiment, and therefore no further description is provided herein.

Different from the conventional art, the present invention teaches removing the gate insulation layer 330 above the corresponding first pad patterns 322 in the process of patterning the semiconductor layer 340 and the metal layer 360 rather than performing the etching process on the gate insulation layer 330 after the formation of the passivation layer 370. In addition, in the process of patterning the passivation layer 370, the second openings H2, the third openings H3 directly exposing the first pad patterns 322, and the fourth openings H4 are formed by merely implementing the photolithography process, and therefore it is not necessary to remove the gate insulation layer 330 in the third openings H3 by performing the etching process after the third openings H3 are formed. Thereby, the passivation layer 370 can be protected from possible damages in the subsequent etching process. On the other hand, in the present embodiment, the channel layer 342, the source patterns 360S, and the drain patterns 360D can be collectively fabricated with use of the same mask. That is to say, one mask can be omitted according to the present embodiment in comparison with the first embodiment. As such, the TFT array substrate of the present invention is capable of protecting the patterned passivation layer 370 from being damaged by the etching process, and the issues regarding the roughened surface of the patterned passivation layer 370, the unfavorable uniformity of the patterned passivation layer 370, and the poor contact caused by the occurrence of the undercut effect or the formation of the unexpected by-products can be further resolved. As a result, the manufacturing yield of the TFT T is improved, the manufacturing process is simplified, and the manufacturing costs are reduced.

Figure 5H:
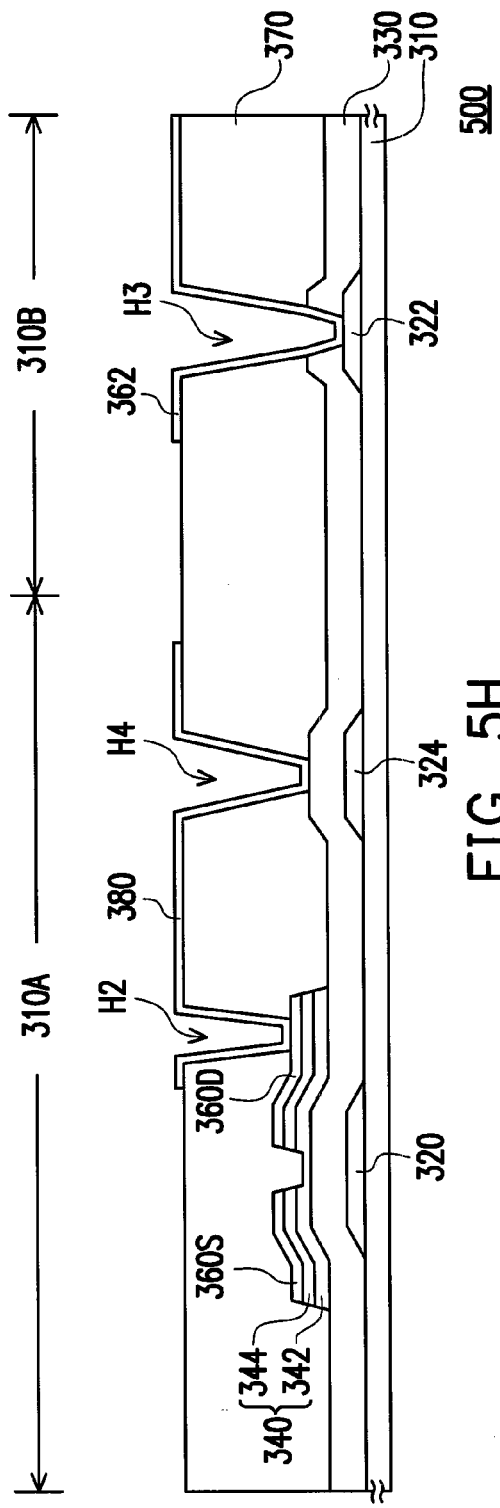

Afterwards, as shown in FIG. 5H, a pixel electrode 380 is respectively formed on the patterned passivation layer 370 within each of the pixel regions 310A, and a plurality of second pad patterns 362 are formed on the patterned passivation layer 370 within the peripheral circuit region 310B. Through the corresponding second opening H2, each of the pixel electrodes 380 is electrically connected to the source pattern 360S or the drain pattern 360D exposed by the corresponding second opening H2. The second pad patterns 362 are electrically connected to the corresponding first pad patterns 322 through the third openings H3, respectively. Besides, through the corresponding fourth opening H4, each of the pixel electrodes 380 is further connected to the gate insulation layer 330 exposed by the corresponding fourth opening H4. The material and the forming method of the pixel electrodes 380 and the second pad patterns 362 are similar to those described in the first embodiment, and therefore no further description is provided herein.

Referring to FIG. 5H, to be more specific, the second pad patterns 362 are electrically connected to the corresponding first pad patterns 322 through the third openings H3, respectively, so as to properly transmit signals from external circuits of the TFT array substrate to the first pad patterns 322 through the second pad patterns 362. On the other hand, the first pad patterns 322 are also likely to transmit the signals of the TFT array substrate to the outside through the second pad patterns 362. Since in the present invention the etching process is not required after the patterned passivation layer 370 is formed, the poor contact between the first pad patterns 322 and the second pad patterns 362 in the third openings H3 due to the undercut effect or the formation of the by-products can be avoided. In addition, each of the pixel electrodes 380 is connected to the gate insulation layer 330 through the corresponding fourth opening H4, such that the first electrode pattern 324, the gate insulation layer 330, and the pixel electrode 380 together constitute a storage capacitor having the MII structure. It is for sure that the present invention should not be construed as limited to the embodiments of the present invention. Practically, the storage capacitor having the MII structure can be replaced with the storage capacitor having the MIM structure upon the different actual product demands or in consideration of the circuit layout. To exemplify the present invention, a manufacturing process of a TFT array substrate equipped with the storage capacitor having the MIM structure is described hereinafter, and only four masks are employed therein.

Fourth Embodiment

Figure 6C:
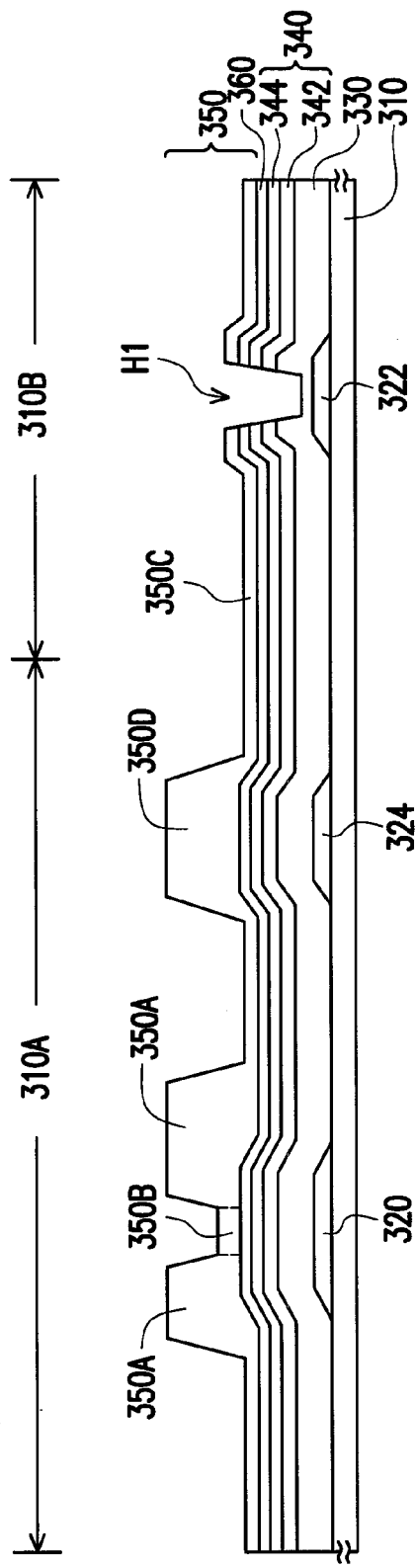
Figure 6D:
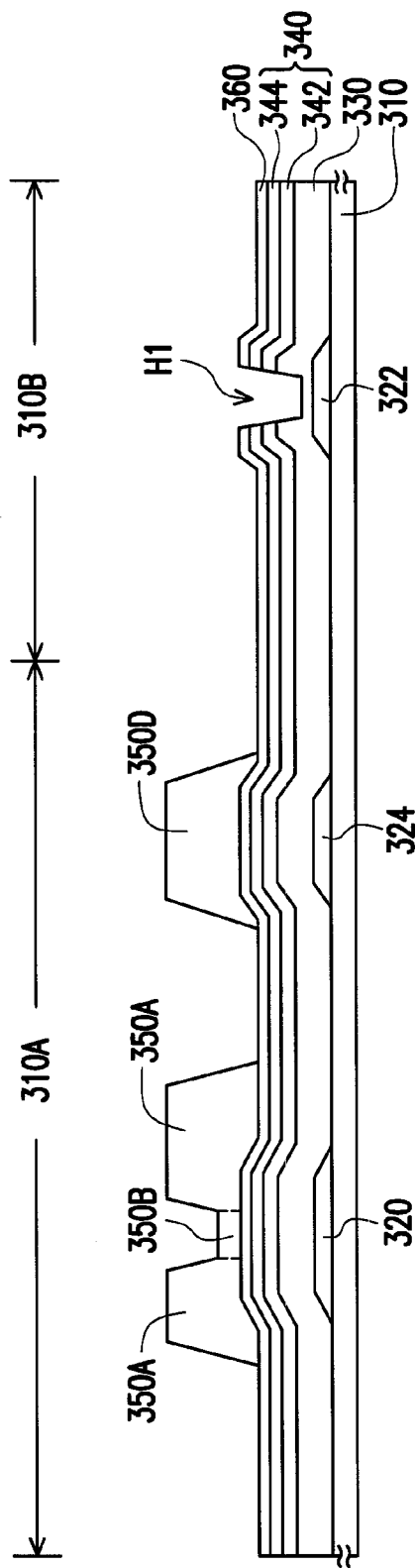

FIGS. 6A through 6H are schematic flowcharts of a fabricating process of another TFT array substrate according to a fourth embodiment of the present invention. The similar manufacturing steps depicted in FIGS. 5A through 5H are not described in the present embodiment for the purpose of simplicity. As shown in FIG. 6B, in comparison with the third embodiment, the patterned photoresist layer 350 of the present embodiment is further composed of a fourth resist block 350D positioned above the corresponding first electrode patterns 324, and a thickness of the fourth resist block 350D is substantially equal to the thickness of the first resist block 350A. Thereafter, as indicated in FIGS. 6C~6F, the metal layer 360 and the semiconductor layer 340 are etched by using the fourth resist block 350D as the mask, and second electrode patterns 364 are formed above the first electrode patterns 324 as shown in FIG. 6E. Here, each of the second electrode patterns 364 is, for example, composed of the channel layer 324, the ohmic contact layer 344, and the metal layer 360.

Figure 6G:
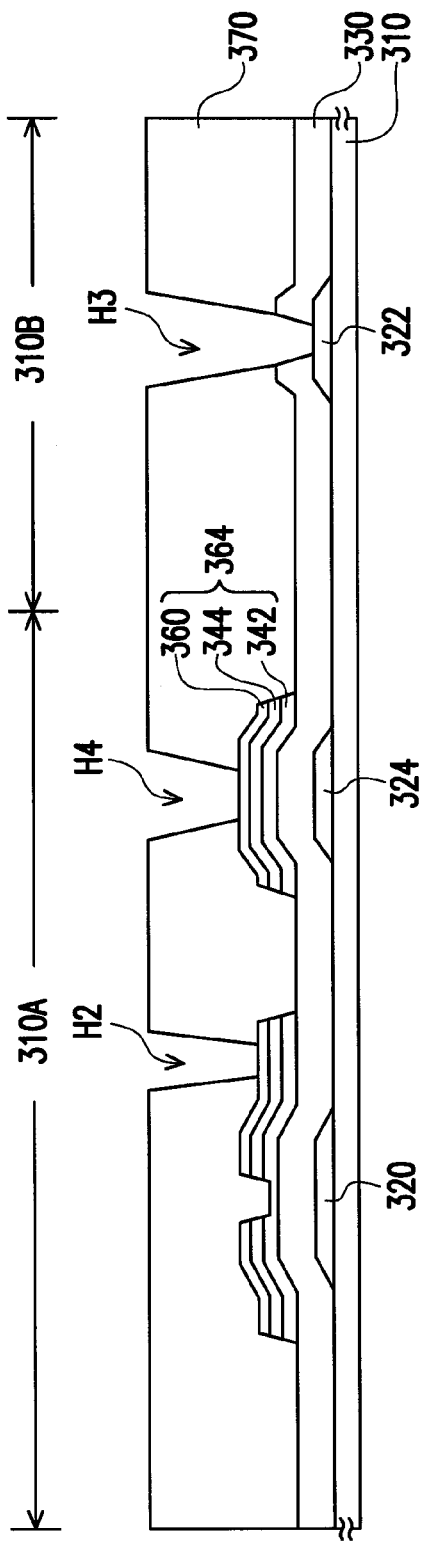
Figure 6H:
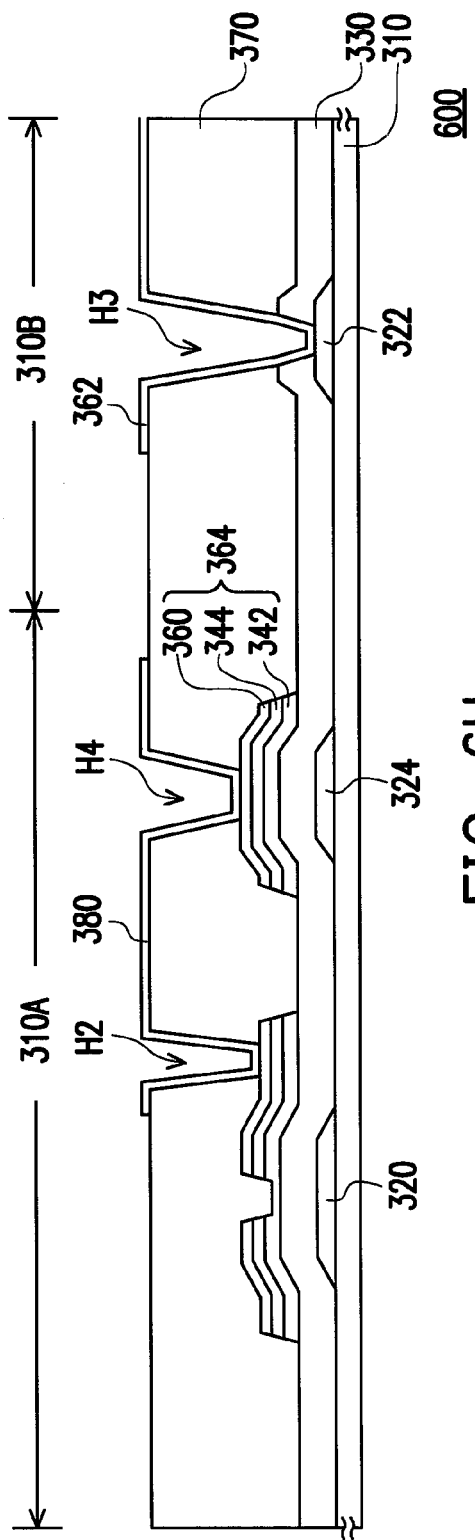

Next, in FIG. 6G, the passivation layer 370 formed in the present embodiment further has the fourth opening H4 in each of the pixel regions 310A. The fourth openings H4 expose the corresponding second electrode patterns 364. After that, as indicated in FIG. 6H, through the corresponding fourth opening H4, each of the pixel electrodes 380 is further connected to the second electrode pattern 364 exposed by the corresponding fourth opening H4 after the formation of the pixel electrodes 380 and the second pad patterns 362. Thereby, the first electrode pattern 324, the gate insulation layer 330, and the second electrode pattern 364 together form the storage capacitor having the MIM structure.

To sum up, the step of removing the gate insulation layer above the pad patterns is advanced in the step of patterning the semiconductor layer according to the present invention. Thereby, after the patterned passivation layer is formed, it is not necessary to etch the gate insulation layer, and the issues regarding the roughened surface of the conventional patterned passivation layer, the unfavorable uniformity of the conventional patterned passivation layer, the undercut effect or the formation of the by-products can be resolved. As such, the treatment step or the ashing process performed for fabricating the storage capacitor having the MII structure according to the pertinent art are both omitted in the present invention. In some of the embodiments of the present invention, only four masks are required in the fabrication process of the TFT array substrate. Therefore, the manufacturing process can be simplified in the present invention, and the manufacturing costs can be reduced effectively.

Although the present invention has been disclosed by the above embodiments, they are not intended to limit the present invention. Anybody skilled in the art may make some modifications and alterations without departing from the spirit and scope of the present invention. Therefore, the protection range of the present invention falls in the appended claims.

What is claimed is:

1. A method for fabricating a thin film transistor array substrate, the method comprising:
providing a substrate, the substrate having a pixel region and a peripheral circuit region that surrounds the pixel region;
forming a gate pattern on the substrate in the pixel region and forming a first pad pattern on the substrate in the peripheral circuit region;
sequentially forming a gate insulation layer, a semiconductor layer, and a metal layer on the substrate for covering the gate pattern and the first pad pattern;
forming a patterned photoresist layer on the metal layer, wherein the patterned photoresist layer comprises a first resist block, a second resist block, and a third resist block, the first resist block and the second resist block are located above the gate pattern, the first resist block within the pixel region is positioned at opposite sides of the corresponding second resist block, the third resist block has a first opening and corresponds to regions on which the gate pattern is not formed, the first opening is positioned above the first pad pattern, a thickness of the first resist block is greater than a thickness of the second resist block, and the thickness of the second resist block is greater than a thickness of the third resist block;
performing an etching process with use of the patterned photoresist layer as a mask for removing the metal layer, the semiconductor layer, and a portion of the gate insulation layer corresponding to the first opening;
reducing a thickness of the patterned photoresist layer until the third resist block is removed to form a first remaining patterned photoresist layer;
performing an etching process with use of the first remaining patterned photoresist layer as the mask for removing the exposed metal layer and the semiconductor layer;
reducing the thickness of the first remaining patterned photoresist layer until the second resist block is removed to form a second remaining patterned photoresist layer;
performing an etching process with use of the second remaining patterned photoresist layer as the mask for removing the exposed metal layer, a portion of the semiconductor layer, and the gate insulation layer corresponding to the first opening, so as to form a source pattern and a drain pattern respectively at opposite sides of the gate pattern within the pixel region;
removing the second remaining patterned photoresist layer; and
forming a patterned passivation layer on the gate insulation layer for covering the source pattern and the drain pattern, wherein the patterned passivation layer has a second opening in the pixel region, the second opening exposes the corresponding source pattern or the corresponding drain region, the patterned passivation layer has a third opening in the peripheral circuit region, and the third opening exposes the first pad pattern.

2. The method as claimed in 1, further comprising:
forming a pixel electrode on the patterned passivation layer within the pixel region, such that through the corresponding second opening a portion of the pixel electrode is electrically connected to the source pattern or the drain pattern exposed by the corresponding second opening, and a portion of the pixel electrode is electrically connected to the corresponding first pad pattern through the third opening.

3. The method as claimed in claim 1, further comprising forming a first electrode pattern on the substrate within the pixel region before the gate insulation layer and the semiconductor layer are formed on the substrate.

4. The method as claimed in claim 1, wherein a material of the patterned passivation layer is an organic insulation material.

5. The method as claimed in claim 1, wherein the step of forming the patterned photoresist layer on the semiconductor layer comprises:
forming a photoresist material layer on the semiconductor layer; and
patterning the photoresist material layer with use of a half-tone mask or a gray-tone mask, so as to simultaneously form the first resist block, the second resist block, the third resist block, and the first opening.

6. The method as claimed in claim 1, wherein the step of reducing the thickness of the patterned photoresist layer comprises performing an ashing process.

7. The method as claimed in claim 1, wherein the semiconductor layer comprises a channel layer and an ohmic contact layer disposed on the channel layer.

8. The method as claimed in claim 7, wherein the step of forming the source pattern and the drain pattern comprises removing a portion of the channel layer and the ohmic contact layer exposed by the source pattern and the drain pattern.

9. The method as claimed in claim 3, further comprising forming a pixel electrode on the patterned passivation layer within the pixel region, wherein through the corresponding second opening a portion of the pixel electrode is electrically connected to the source pattern or the drain pattern exposed by the corresponding second opening, the patterned passivation layer further has a fourth opening within the pixel region, the fourth opening exposes the gate insulation layer above the first electrode pattern, and through the corresponding fourth opening a portion of the pixel electrode is connected to the gate insulation layer exposed by the corresponding fourth opening.

10. The method as claimed in claim 3, wherein the patterned photoresist layer comprises a fourth resist block positioned above the first electrode pattern, and a thickness of the fourth resist block is substantially equal to the thickness of the first resist block.

11. The method as claimed in claim 10, further comprising etching the metal layer and the semiconductor layer with use of the fourth resist block as the mask and forming a second electrode pattern above the first electrode pattern.

12. The method as claimed in claim 10, wherein the patterned passivation layer has a fourth opening in the pixel region, the fourth opening exposes the corresponding second electrode pattern, and through the corresponding fourth opening the pixel electrode is connected to the second electrode pattern exposed by the corresponding fourth opening.

* * * * *